United States Patent
Schenk et al.

(10) Patent No.: US 12,428,290 B2
(45) Date of Patent: Sep. 30, 2025

(54) BENDING TRANSDUCER AS ACTUATOR, BENDING TRANSDUCER AS SENSOR, BENDING TRANSDUCER SYSTEM

(71) Applicant: Fraunhofer-Gesellschaft zur Förderung der angewandten Forschung e.V., Munich (DE)

(72) Inventors: Hermann Schenk, Dresden (DE); Bert Kaiser, Dresden (DE); Lutz Ehrig, Dresden (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 956 days.

(21) Appl. No.: 17/228,380

(22) Filed: Apr. 12, 2021

(65) Prior Publication Data
US 2021/0229979 A1  Jul. 29, 2021

Related U.S. Application Data

(63) Continuation of application No. PCT/EP2018/078298, filed on Oct. 16, 2018.

(51) Int. Cl.
*B81B 3/00* (2006.01)
*B81B 7/00* (2006.01)

(52) U.S. Cl.
CPC .......... *B81B 3/0021* (2013.01); *B81B 3/0086* (2013.01); *B81B 7/008* (2013.01)

(58) Field of Classification Search
CPC ..... B81B 3/0021; B81B 7/008; B81B 3/0086; B81B 3/0043; H02N 1/006
See application file for complete search history.

(56) References Cited

U.S. PATENT DOCUMENTS

| | | |
|---|---|---|
| 4,163,162 A | 7/1979 | Micheron |
| 5,344,117 A | 9/1994 | Trah et al. |
| (Continued) | | |

FOREIGN PATENT DOCUMENTS

| | | |
|---|---|---|
| CN | 101147223 A | 3/2008 |
| CN | 102884352 A | 1/2013 |
| (Continued) | | |

OTHER PUBLICATIONS

F. Hunt, "Electroacoustics", John Wiley & Sons, Inc. NY 1954.
(Continued)

*Primary Examiner* — Christopher M Koehler
*Assistant Examiner* — Viswanathan Subramanian
(74) *Attorney, Agent, or Firm* — Perkins Coie LLP; Michael A. Glenn

(57) ABSTRACT

A bending transducer includes a deflectable element, a microelectromechanical transducer extending along a centroid fiber of the deflectable element deflecting the deflectable element in a first direction when a first electrical signal is applied, and a second microelectromechanical transducer extending along the centroid fiber deflecting the deflectable element in a second direction opposite to the first direction when a second electrical signal is applied, the centroid fiber being located between sides of the first and second microelectromechanical transducers facing away from each other, and an electrical control configured to vary the first and second electrical signals depending on an input signal such that a change of the first electrical signal and a change of the second electrical signal depends on the electrical input signal, and the phases of the first and second electrical signals are shifted relative to each other. A bending transducer operated as sensor is also presented.

11 Claims, 23 Drawing Sheets

(56) References Cited

U.S. PATENT DOCUMENTS

| | | | |
|---|---|---|---|
| 9,676,607 B2 | 6/2017 | Gaudet et al. | |
| 9,783,408 B2 | 10/2017 | Lan et al. | |
| 10,483,876 B2 | 11/2019 | Langa et al. | |
| 2004/0163478 A1* | 8/2004 | Xu | H10N 30/074 257/E27.006 |
| 2008/0237024 A1 | 10/2008 | Millet | |
| 2009/0174014 A1 | 7/2009 | Kunze et al. | |
| 2012/0210794 A1* | 8/2012 | Goehlich | G01M 7/022 73/579 |
| 2013/0055889 A1 | 3/2013 | Herz et al. | |
| 2013/0062710 A1 | 3/2013 | Dehe | |
| 2013/0301101 A1 | 11/2013 | Conrad et al. | |
| 2014/0291787 A1 | 10/2014 | Lan et al. | |
| 2015/0309307 A1 | 10/2015 | Naono | |
| 2016/0304333 A1 | 10/2016 | Gaudet et al. | |

FOREIGN PATENT DOCUMENTS

| | | |
|---|---|---|
| CN | 103121657 A | 5/2013 |
| CN | 104297919 A | 1/2015 |
| CN | 206743129 U | 12/2017 |
| DE | 102015206774 A1 | 10/2016 |
| DE | 102015210919 A1 | 12/2016 |
| EP | 2664058 B1 | 11/2013 |
| FR | 2376549 A1 | 7/1978 |
| JP | 2010162508 A | 7/2010 |
| JP | 2014508648 A | 4/2014 |
| JP | 2017007085 A | 1/2017 |
| WO | 2012095185 A1 | 7/2012 |
| WO | 2013145411 A1 | 10/2013 |
| WO | 2016202790 A2 | 12/2016 |

OTHER PUBLICATIONS

B. Kaiser—Dissertation—"Simulation und Charakterisierung eines neuartigen mikromechanischen elektrostatischen Aktors"—Dresden, 1987.

L. Baxter, "Capacitive Sensors: Design and Applications", IEEE Press, p. 63, 1997.

P. Wambacq, "Distortion Analysis of Analog Integrated Circuits", Kluwer Academic Publishers, Boston, 1998.

I. Kovacic et al., "The Duffing Equation: Nonlinear Oscillators and their Behaviour", Wiley, 2011, 392 pp, 2011.

F. Stoppel et al., "Leistungsfähiger integrierter MEMS-In-Ear-Lautsprecher mit piezoelektrischem Antrieb", DAGA 2018.

* cited by examiner

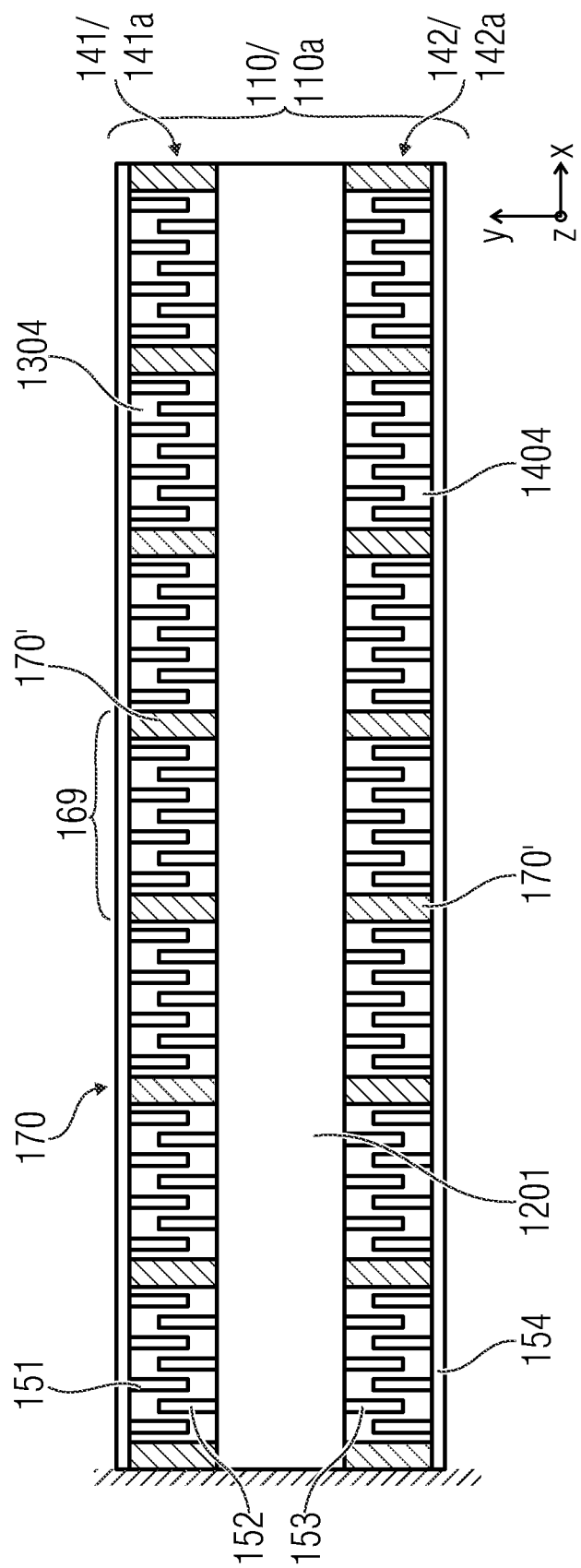

BENDING TRANSDUCER AS ACTUATOR, BENDING TRANSDUCER AS SENSOR, BENDING TRANSDUCER SYSTEM

CROSS-REFERENCE TO RELATED APPLICATIONS

This application is a continuation of copending International Application No. PCT/EP2018/078298, filed Oct. 16, 2018, which is incorporated herein by reference in its entirety.

This invention relates to a bending transducer and its use as actuator or sensor and a bending transducer system.

BACKGROUND OF THE INVENTION

Micromechanical devices (MEMS) are needed to convert electrical signals into a mechanical effect, namely in the case of actuators, or to convert a mechanical effect into an electrical signal, namely in the case of sensors. For the purposes of this application, 'effect' means, for example, the carrying out work and the associated deflection or application of bending moments.

The linearity of the relationship between electrical signal and mechanical effect (transmission characteristic) of microelectromechanical components is regularly subject to high demands. This applies, for example, to the use of such microelectromechanical components for use in microphones or loudspeakers. Non-linearities of the transmission characteristics adversely affect the precision with which microelectromechanical components can fulfil their intended function and have to be corrected with complex controls in the case of actuators or with complex signal processing in the case of sensors.

For example, non-linearities in the transmission characteristics of micromechanical sound transducers, i.e. loudspeakers or microphones, lead to high distortion factors and have to be corrected by the additional use of microprocessors or signal processing.

In summary, there are practical applications, such as micro-loudspeakers, where a linear relationship between the level of the applied signal voltage and the magnitude of the mechanical effect produced by the apparatus, i.e. the work to be carried out, is crucial. At the same time, the spectral composition of the output signal (in the case of a loudspeaker, the airborne sound) should be identical to the spectral composition of the input signal, which corresponds to a low distortion factor. The linearity range depends on the amplitude and frequency and should be as large as possible. For this, it is needed to vary the sensitivity and the frequency by changing the (electrical) operating parameters without changing the linearity significantly. For the purposes of this application, sensitivity means the relationship between a change in effect and a change in signal. Previous design implementations of MEMS devices with improved linearity of the transmission characteristics are based on MEMS technologies with unfavorably high voltage requirements in a structurally limited dynamic range (with respect to pull-in instability) and thus a limited frequency range, which are unsuitable for mobile applications. Reference is made exemplarily to document US 97 834 08 B2.

WO 2095185 A1 describes how to design MEMS devices having high performance with low power consumption, but does not describe possible measures to improve and adjust linearity. For the purpose of increasing the bending radius or increasing the drive efficiency with the same bending characteristics, a bending transducer system consisting of two bending transducers separated by a neutral fiber is proposed in DE 10 2015 206 774 A1. The cavity formed in the process is only intended to have a positive effect on the bending characteristics. Measures to improve and adjust linearity are not disclosed.

SUMMARY

According to an embodiment, a bending transducer as actuator with a deflectable element may have: a microelectromechanical transducer extending along a centroid fiber of the deflectable element that deflects the deflectable element in a first direction when a first electrical signal is applied, and a second microelectromechanical transducer extending along the centroid fiber that deflects the deflectable element in a second direction opposite to the first direction when a second electrical signal is applied, the centroid fiber being located between sides of the first and second microelectromechanical transducers facing away from each other, and an electrical control configured to vary the first electrical signal and the second electrical signal depending on an input signal, such that a change of the first electrical signal and a change of the second electrical signal depend on the electrical input signal, and the phases of the first and second electrical signals are shifted with respect to one another.

According to anther embodiment, a bending transducer as sensor with a deflectable element may have: a first microelectromechanical transducer extending along a centroid fiber of the deflectable element, at the terminal of which a first electrical signal can be determined in accordance with a deformation of the deflectable element, a second microelectromechanical transducer extending along the centroid fiber of the deflectable element, at the terminal of which a second electrical signal can be determined in accordance with the deformation of the deflectable element, the centroid fiber being located between sides of the first and second microelectromechanical transducers facing away from each other, and an electrical circuit configured to generate an output signal from the first electrical signal and the second electrical signal, such that a change of the output signal depends on a difference between a change of the first electrical signal and a change of the second electrical signal.

According to anther embodiment, a bending transducer system may have a plurality of inventive bending transducers and a circuit configured to cause a first part of the total amount of the bending transducers to be operated as actuators and a second part of the total amount of the bending transducers to be operated as sensors, the partitioning of the subsets depending on a control signal.

According to another embodiment, a bending transducer system may have a plurality of inventive bending transducers, wherein a bending transducer is controlled in a time interval both as actuator and as sensor, or the bending transducer is controlled in a first time interval as sensor and in a second time interval as actuator, or the bending transducer is controlled in a first time interval as actuator and in a second time interval as sensor.

A core idea of the present application is that a bending transducer used as an actuator can be provided with improved and adjustable linearity at comparable performance when the bending transducer comprises a deflectable element having a first microelectromechanical transducer (hereinafter referred to as MEMS transducer for short) extending along the centroid fiber of the deflectable element and a second MEMS transducer extending along the centroid fiber, the centroid fiber being located at least between the distal edges or sides of the MEMS transducers facing away from each other or even between the MEMS transducers and the deflectable element is deflected in opposite directions when a first or second electrical signal is applied to the first or second MEMS transducer, and when the variation of the first and second electrical signals is performed in dependence on the electrical input signal such that the phases of the first and second electrical signals are shifted relative to one another. The phase shift can be between 0.001°-240°, both inclusive, or even between 60-200°, both inclusive, or 180°. This embodiment allows to obtain the advantages in terms of linearity that would otherwise be possible using a three-electrode principle with symmetrical control to be achieved without suffering from performance problems. According to the invention, by the control, a large linearity range with high dynamics, i.e. a large amplitude range, in a large frequency range can be obtained. Similarly, part of the core idea of the present application is to have recognized that a bending transducer used as a sensor can be obtained with improved and adjustable linearity at comparable performance when the bending transducer is equipped with a deflectable element in which the centroid fiber of the deflectable element is again located between the opposite sides of the first and second MEMS transducers, and when the electrical signals output at the terminals of the transducers upon deformation of the deflectable element are used to generate an output signal such that a change of the output signal depends on a difference of a change of the first electrical signal at the first transducer and a change of the second electrical signal at the second transducer. On the one hand, the linearity can be optimized during load changes, on the other hand, the sensitivity and selectivity (in this case the resonance frequency) can be adapted application-specifically in order to maximize the linear dynamic range (in this case the amplitude) and the linear frequency band.

According to embodiments, the first and second MEMS transducers are each plate capacitors that are subdivided into segments along a longitudinal direction of the deflectable element and thus also along the centroid fiber, by fixing electrodes of the respective plate capacitors between the segments against each other. In this way, the deflection of the bending transducers can be large in relation to the distance between the two electrodes.

The centroid fiber can be located at least between sides of the MEMS transducer facing away from each other, i.e. opposite sides of the distal electrodes or electrodes of the MEMS transducers positioned spaced apart from each other, or even between the distal electrodes of the MEMS transducers, or between opposite sides of proximal electrodes or electrodes least distant of one another of the MEMS transducers or even between the MEMS transducers, i.e. facing sides of the proximal electrodes of the MEMS transducers. In some of these embodiments, the electrodes of the respective plate capacitor are configured in an interdigital manner in the segments, so that projections of one electrode project in gaps between corresponding projections of the other electrode, and vice versa. This increases performance and sensitivity.

In the embodiments using the bending transducer as actuator, the electrical drive is arranged to apply a combination of a first bias and a first signal portion depending on the input signal as the first electrical signal to the first MEMS transducer and/or a combination of a second bias and a second signal portion depending on the input signal as the second electrical signal to the second MEMS transducer. The electrical signals can be, e.g., electrical voltages or electrical currents. The control of the MEMS transducers of the bending transducer, which is used as an actuator, can consist of two concatenated network loops with a bias $U_0$ and a variable signal voltage $U_{signal}$. Thereby, the electrical control is configured to perform the change of the first and second electrical signals with different amplitude to compensate an asymmetrical load on the deflectable element. The asymmetrical load is, for example, a structural asymmetry of the microelectromechanical transducer and/or an asymmetrical force acting on the deflectable element, such as pressure differences. Similarly, a bending transducer used as a sensor can compensate an asymmetrical load on the deflectable element. The control of a bending transducer used as a sensor can be configured to apply a bias to the first MEMS transducer and/or to the second MEMS transducer. According to embodiments, the bias or biases of the bending transducers are set in such a way that the centroid fiber of the deflectable element is not deflected without external mechanical influences on the deflectable element and, in the case of a bending transducer used as an actuator, without signal portions depending on the input signal.

According to embodiments, the bending transducer is thus provided with a control which is configured to apply a bias to the first and/or to the second MEMS transducer, whereby an effective spring stiffness of the bending transducer and/or the sensitivity of the bending transducer and/or the resonance frequency of the bending transducer can be adjusted by adjusting the bias or biases at the first and/or at the second MEMS transducer. The effective spring stiffness of the MEMS transducer changes in relation to its mechanical spring stiffness with the level of the fixed voltage or bias. This embodiment makes it possible to adjust the linearity.

According to embodiments, the electrical control of the bending transducer, which is used as an actuator, has a feedback loop in order to dynamically compensate the effect of the asymmetrical load by means of a suitable feedback loop with sensors, i.e. during operation with alternating load. Alternatively, active network components such as transistors, operational amplifiers, etc. can be used to adjust the relevant electrical network parameters, such as power consumption, impedances, voltages, currents, to the respective load situation. Overall, the feedback system means dynamically improved linearity of the transmission characteristic.

According to embodiments, a bending transducer system comprises a plurality of bending transducers, wherein the bending transducers match the dimensioning of the MEMS transducers. In other words, the bending transducers can be configured identically. The effective spring stiffness and/or the resonance frequency and/or the sensitivity of the bending transducers can be individually adjusted via the bias at the first and/or second MEMS transducers of the majority of bending transducers. One advantage is that the resonance frequencies or the dynamic behavior below the resonance frequency can be individually adjusted via the bias depending on an application situation. Overall, improved linearity can thus be achieved since each bending transducer is only responsible for a specific frequency band and deviations in performance between the frequency bands can be compensated by assigning different numbers of bending transducers to the frequency bands. In other words, it is possible to associate bending transducers configured identically to the individual frequency bands to which the same are then sensitive by means of individual bias control in different proportions. The proportions can compensate that bending transducers are more sensitive/effective or less sensitive/effective for one frequency band than those for another frequency band.

Some embodiments relate to a bending transducer system with a circuit configured to spectrally split a total input signal into a plurality of input signals for the plurality of bending transducers or to spectrally combine a total output signal from a plurality of output signals of the plurality of bending transducers. The circuit can be partially or completely a part of the control. One aspect of the spectral splitting of the total input signal or spectral composition of the output signal is the finding that the linearity of the microelectromechanical transducers can be increased by arranging several bending transducers. The arrangement can be designed in such a way that the effects of the individual bending transducers add up so that the individual bending transducers of the arrangement are only operated in a fraction of the dynamic range (e.g. deflection). This improves the linearity of the overall system.

Some embodiments relate to a bending transducer configured to function either as an actuator or as a sensor and a circuit designed to operate the bending transducer as an actuator or as a sensor. The configurations are space-saving, since the same bending transducer can be used either as a sensor or as an actuator, depending on the application.

Some embodiments relate to a bending transducer system with a plurality of bending transducers and a circuit configured to control a first part of the total amount of bending transducers as actuators and a second part of the total amount of bending transducers as sensors. The division into the two subsets can be static or can be performed dynamically depending on a control signal. A bending transducer can be controlled in one time interval both as actuator and as sensor or in a first time interval as sensor and in a second time interval as actuator or in a first time interval as actuator and in a second time interval as sensor. The number of sensors or actuators can be adjusted via a static or a dynamic control signal depending on the application area.

BRIEF DESCRIPTION OF THE DRAWINGS

Embodiments of the present invention will be detailed subsequently referring to the appended drawings, in which:

FIG. 7b is a diagram of the transmission characteristics of the embodiment shown in FIG. 7a;

FIG. 19c is a schematic representation of the cross-section of an electrostatically deflectable and cantilevered cantilever with comb-shaped electrodes;

FIG. 20b is a schematic representation of a deflectable element having a central cavity in addition to FIG. 20a;

FIG. 22 is a schematic representation of a cantilevered deflectable element with asymmetrical configuration of the two MEMS transducers compared to FIG. 19a.

DETAILED DESCRIPTION OF THE INVENTION

Before the embodiments of this invention will be described below, it is first explained which considerations led the inventors to the same. In the course of these explanations, of course, references are already made to features of the embodiments described below, which should also be transferable to the same.

Nonlinearities of microelectromechanical components have their origin both in the electromechanical construction and its operating principle, so-called static nonlinearities, and in the dynamic behavior of the devices, so-called dynamic nonlinearities. Dynamic nonlinearities are the result of mechanical and/or electrical design features. Dynamic nonlinearities, such as intermodulation, operating point drift, subharmonic resonances, are regularly the result of static nonlinearities. The correction of existing dynamic nonlinearities is technically complex if it is practicable at all under the given circumstances.

MEMS devices of the form considered here have at least one deformable element. The force needed for deformation can be characterized by a spring characteristic curve. A strictly linear transmission behavior entails that the corresponding spring characteristic curve at the selected operating point is strictly linear over the entire selected dynamic range.

Figure 1:
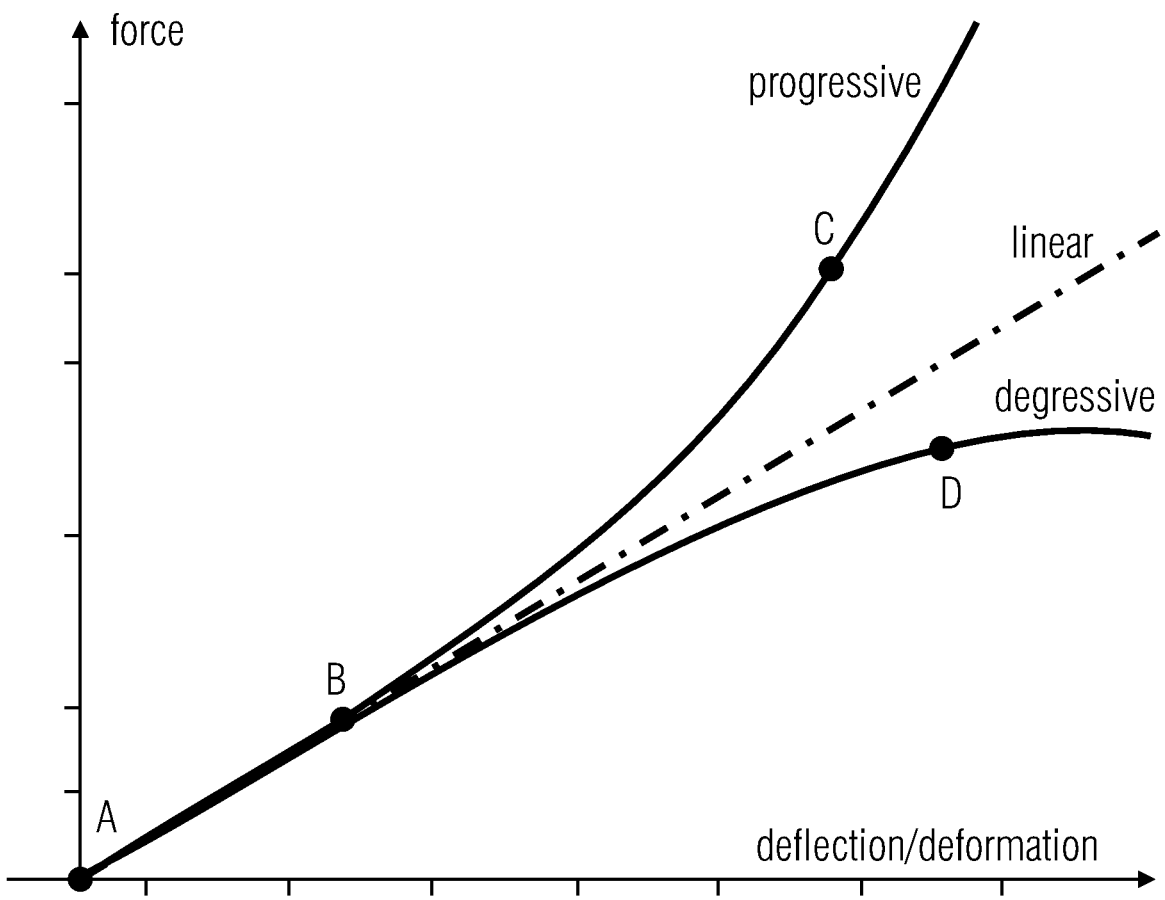
FIG. 1 is a diagram of the spring characteristic curve of the deformable element of microelectromechanical devices.

FIG. 1 shows the spring characteristic curve of a deformable element. If the relevant deformable elements are beams, plates or plate segments, the course of the associated spring characteristics for larger deflections is not linear, but partly or completely progressive or degressive. Alternatively, a combination can also occur. In a first time interval degressive, in a second time interval progressive. A progressive or degressive spring characteristic regularly results in a disadvantageous, non-linear transmission characteristic. For the operation of a MEMS device, an operating point, such as A, B, C or D, can be selected at the corresponding spring characteristic curve, around which the deformable element preforms its movement with a specific maximum amplitude or dynamic range. This applies, for example, to a relatively large dynamic range at operating point A. At operating point B, the possible dynamic range for linear operation is limited by the onset of the progressive or degressive course of the spring characteristic curve. Selecting the operating point C or D results in a MEMS device with high sensitivity, i.e. the spring characteristic curve is particularly steep here. The change in this increase has a higher quantitative level here and thus has a negative effect on the dynamic range.

Figure 2:
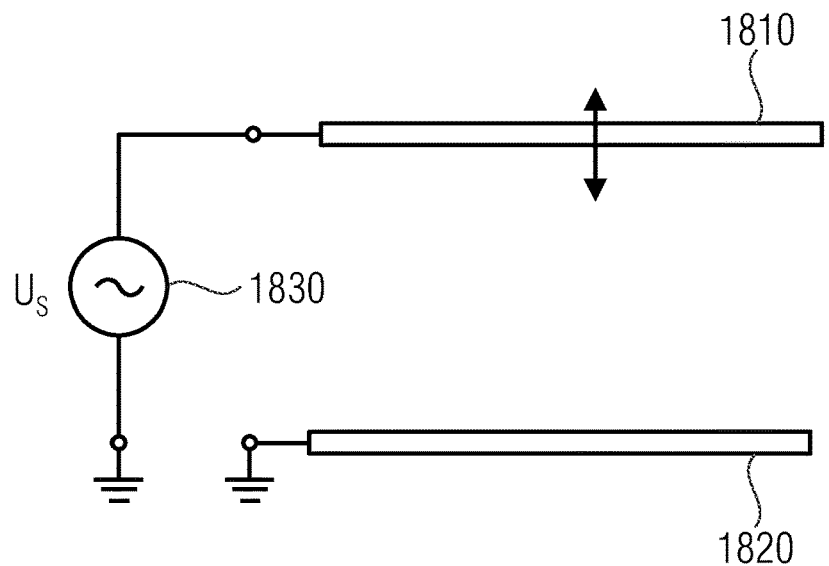
FIG. 2 is a schematic representation of the two-electrode principle.

FIG. 2 shows a MEMS device based on the two-electrode principle. Capacitively operating MEMS devices according to the two-electrode principle include at least one deformable or movable element, a so-called translator or shuttle 1810, which is configured as electrode and the spring characteristic curve of which is illustrated in FIG. 1, and a further fixed counter-electrode, the so-called stator 1820. When a voltage 1830 is applied, the electrostatic attraction forces generated between the electrodes pull the translator 1810 towards the stator 1820. The attraction is independent of the sign of the applied voltage 1830. When used as a sensor, the device changes its capacitance when the translator 1810 is mechanically affected. In this case, the capacity change is used to generate an output signal.

Figure 3:
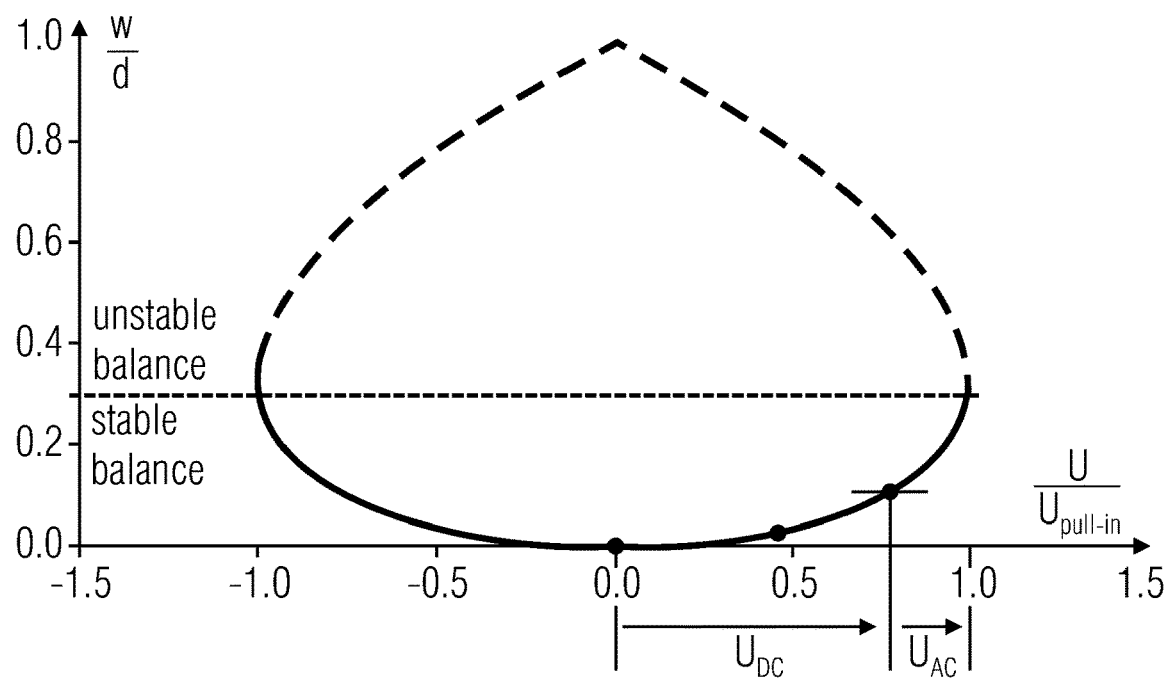
FIG. 3 is a diagram of the relationship between the deflection and the signal voltage of an actuator according to the two-electrode principle.

FIG. 3 shows the typical relationship between electrical signal strength or voltage and mechanical deformation or deflection for a MEMS device according to the two-electrode principle, as illustrated in FIG. 2. To operate a capacitive MEMS device according to the two-electrode principle, an operating point (e.g. A, B or C) is selected by applying a bias $U_{DC}$. In the case of a bending transducer that is used as an actuator, a signal voltage $U_{AC}$ can be superimposed on this bias. In the case of a bending transducer used as a sensor, a mechanical action can effect a movement and generate a corresponding signal voltage around the operating point. The absolute sum of bias and signal voltage should not exceed the critical voltage amount, the so-called pull-in voltage $U_{pull-in}$. This critical voltage value is defined by the fact that for voltages above this limit, the equilibrium of mechanical and electrical forces needed for the intended function is unstable and therefore irrelevant.

The operating point A needs a bias equal to zero. Although the spring characteristic curve, as illustrated in FIG. 1, is practically linear at this operating point, the signal voltage generates a movement in only one direction regardless of its sign and thus causes a strongly non-linear transmission behavior, such as frequency doubling or a dynamically caused shift of the operating point.

The operating point B enables a change of direction of the movement of the deformable element with the change of the sign of the signal voltage. The course of the allocated spring characteristic curve also enables a linear transmission behavior with a bias selected to be sufficiently small; however, the maximum possible deflection or dynamic range in linear operation is severely limited by the low maximum possible deflection with negative signal voltage.

The operating point C enables a change of direction of the movement of the deformable element with the change of the sign of the signal voltage and basically a large dynamic range. However, in the vicinity of the operating point, both the associated spring characteristic curve and the deflection-voltage characteristic are strongly non-linear.

Therefore, design-related non-linearities are characteristic for the two-electrode principle are. This means that the mechanical movement performed by the device as intended does not follow the electrical input signal proportionally. Such non-linearities can essentially only be reduced within narrow limits by applying a temporally constant bias as the operating point in conjunction with a disadvantageous restriction of the maximum permissible amplitude of the mechanical movement. A further problem is that an advantageous sensitivity increase of the device compared to the variation of the input signal by increasing the constant electrical bias or operating point has a disadvantageous effect on linearity. A further problem of the mentioned apparatuses is that the non-linearity given there generates even-order harmonics with the result that the geometric position of the zero point of a mechanical oscillation carried out by the apparatus according to its intended purpose shifts dynamically. This case distinction also applies analogously when using the capacitive MEMS device as sensor according to the two-electrode principle.

Figure 4A:
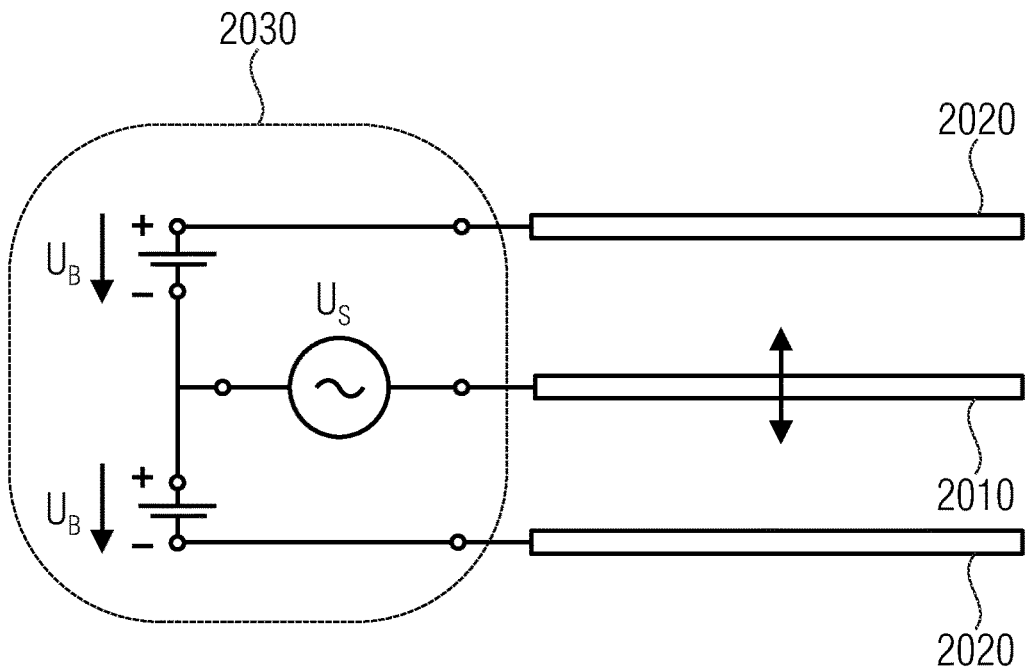
FIG. 4a is a schematic representation of a variant of the push-pull principle.
Figure 4B:
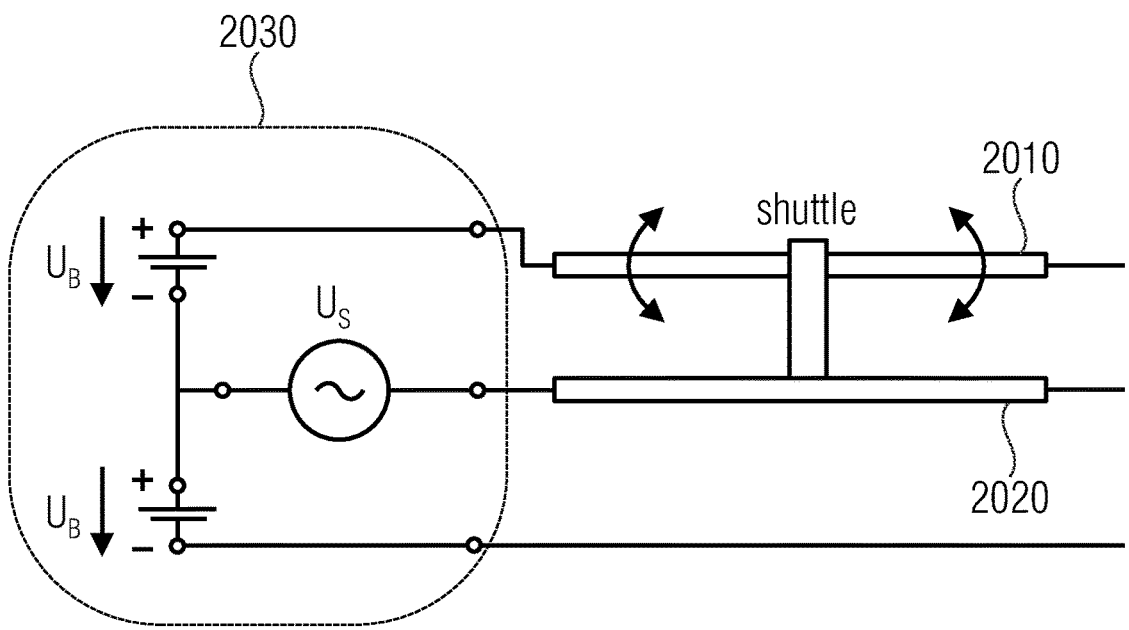
FIG. 4b is a schematic representation of a variant of the push-pull principle.

In addition, there are capacitive MEMS devices based on the three-electrode principle. FIGS. 4a and 4b illustrate MEMS devices based on the three-electrode principle or push-pull principle with at least one movable or deformable element or translator 2010 and one stationary element or stator 2020. The three-electrode arrangement is operated by means of a fixed bias $U_B$ and additionally with a variable signal voltage $U_S$. The electrode arrangement allows electrical control 2030 in such a way that the translator 2010 can be deflected in two opposite directions with respect to the stator 2020 by the resulting electrostatic forces. To enable this, stator 2020 and translator 2010 are provided with a total of at least three electrodes with different functions. The three-electrode principle, with its symmetrical design, improved the linearity behavior minimally, but with disadvantages such as the pull-in risk and disadvantages in terms of low performance.

Figure 5:
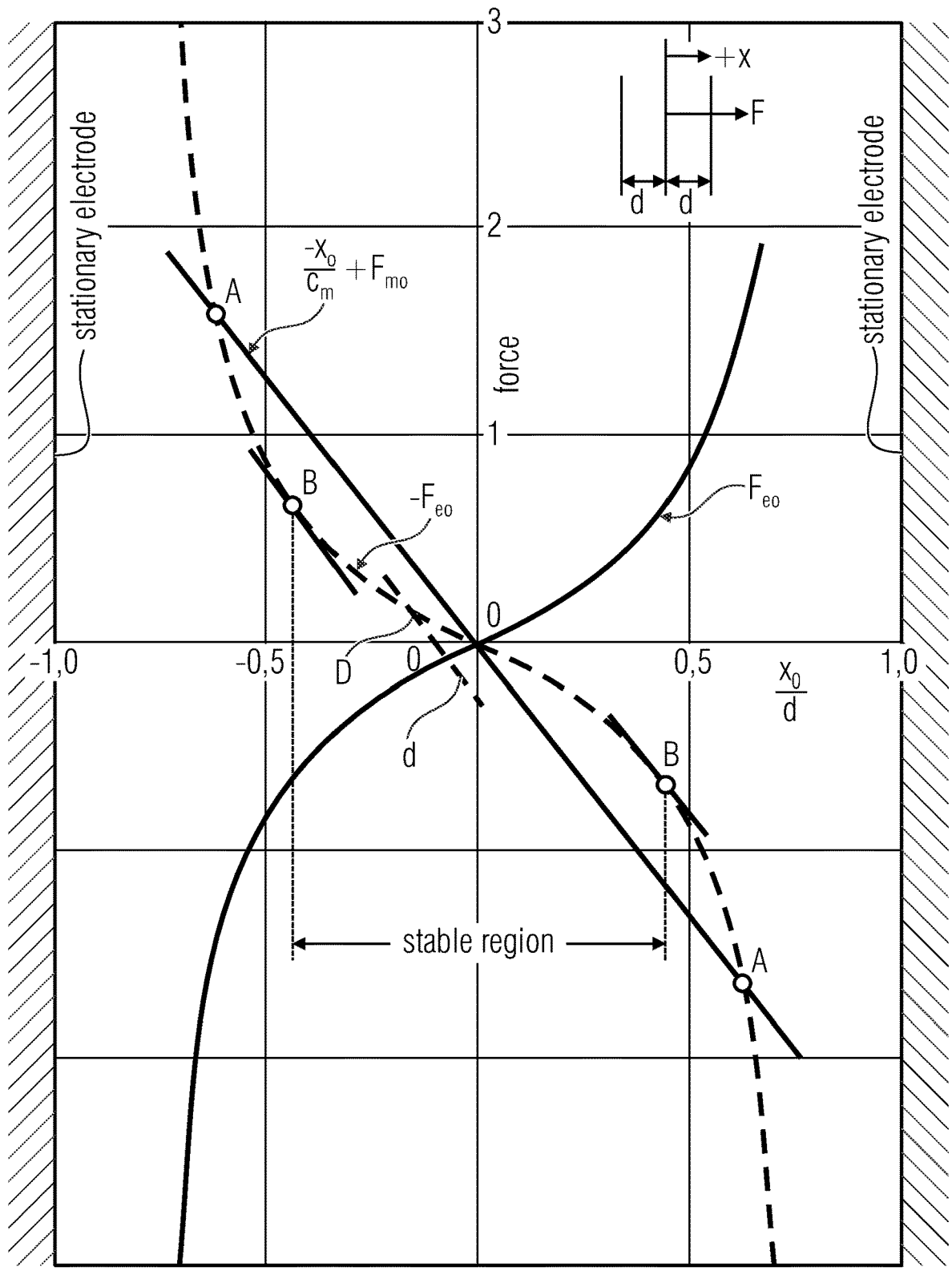
FIG. 5 is a diagram of the relationship between electrical signal strength and mechanical deformation according to the three-electrode principle.

FIG. 5 shows the typical relationship between electrical signal strength or voltage and mechanical deformation or deflection for a MEMS device based on the three-electrode principle, as illustrated in FIGS. 4a and 4b, in the case of symmetrical control. With symmetrical control, the rest position of the translator, i.e. at a signal voltage of zero, is independent of the electrical bias. At the working point, the deformable element is mechanically in rest position, i.e. not deformed. This means that both the spring characteristic curve and the characteristic of the relationship between deflection and signal voltage at the operating point and for a maximum dynamic range are linear.

In the following, the basic structure of a bending transducer and bending transducer system and their basic mode of operation will be described based on the schematic illustrations.

Figure 6:
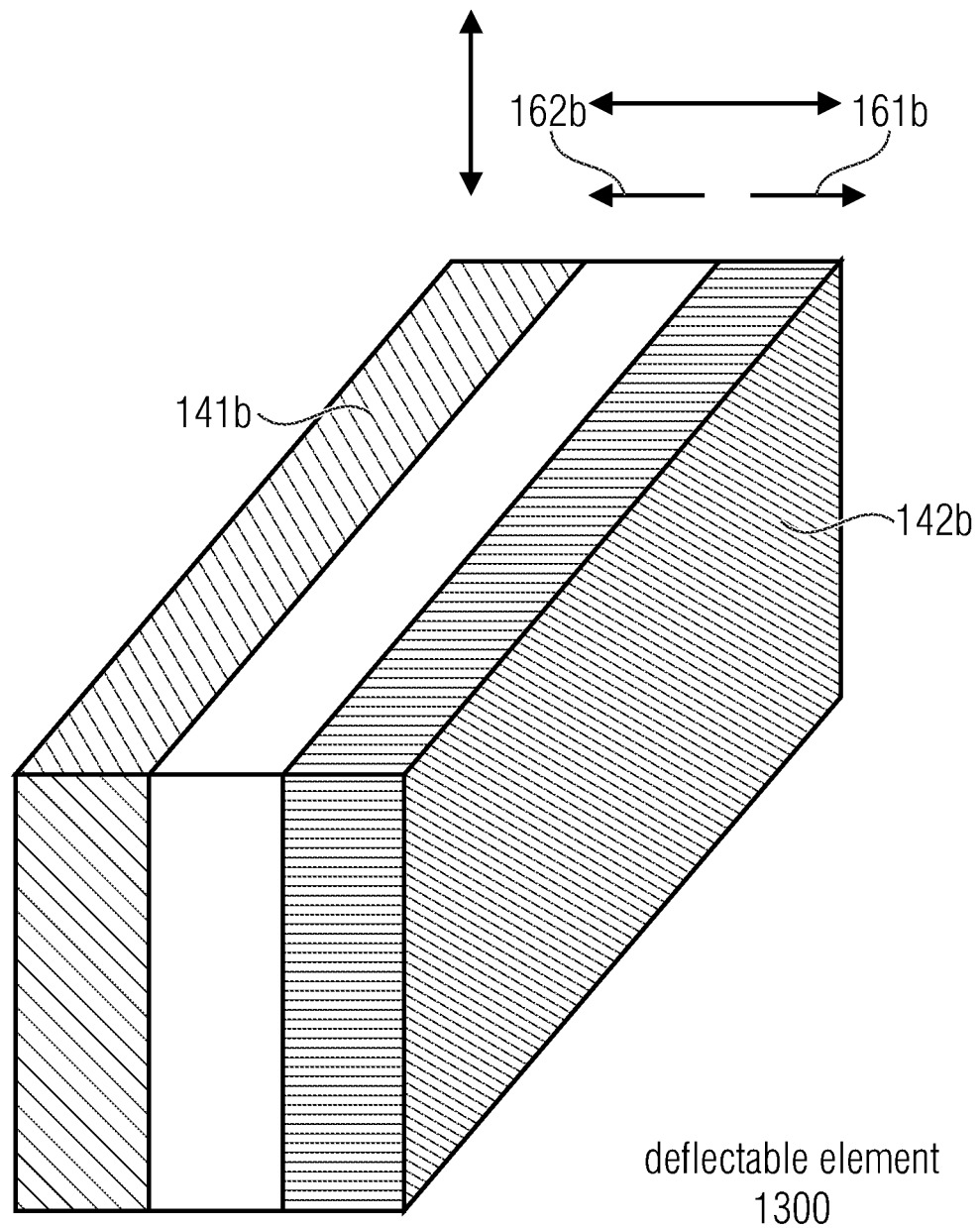
FIG. 6 is a schematic representation of a deformable element with active layers attached on both sides.

FIG. 6 shows a schematic perspective view of a deformable or deflectable element 1300 with active layers or MEMS transducers 141b and 142b attached on both sides. When a first electrical signal is applied to the MEMS transducer 141b, the deflectable element 1300 is deflected in a first direction 161b. Similarly, when a second electrical signal is applied to the MEMS transducer 142b, the deflectable element 1300 is deflected in a second direction 162b opposite to the first direction.

The improved linearity of the transmission characteristic of the deflectable element can be achieved by a symmetrical configuration of the deformable element 1300 and a symmetrical configuration and symmetrical arrangement of the bimorph structures 141b, 142b on the deformable element 1300 in combination with a symmetrical electrical control.

Figure 7A:
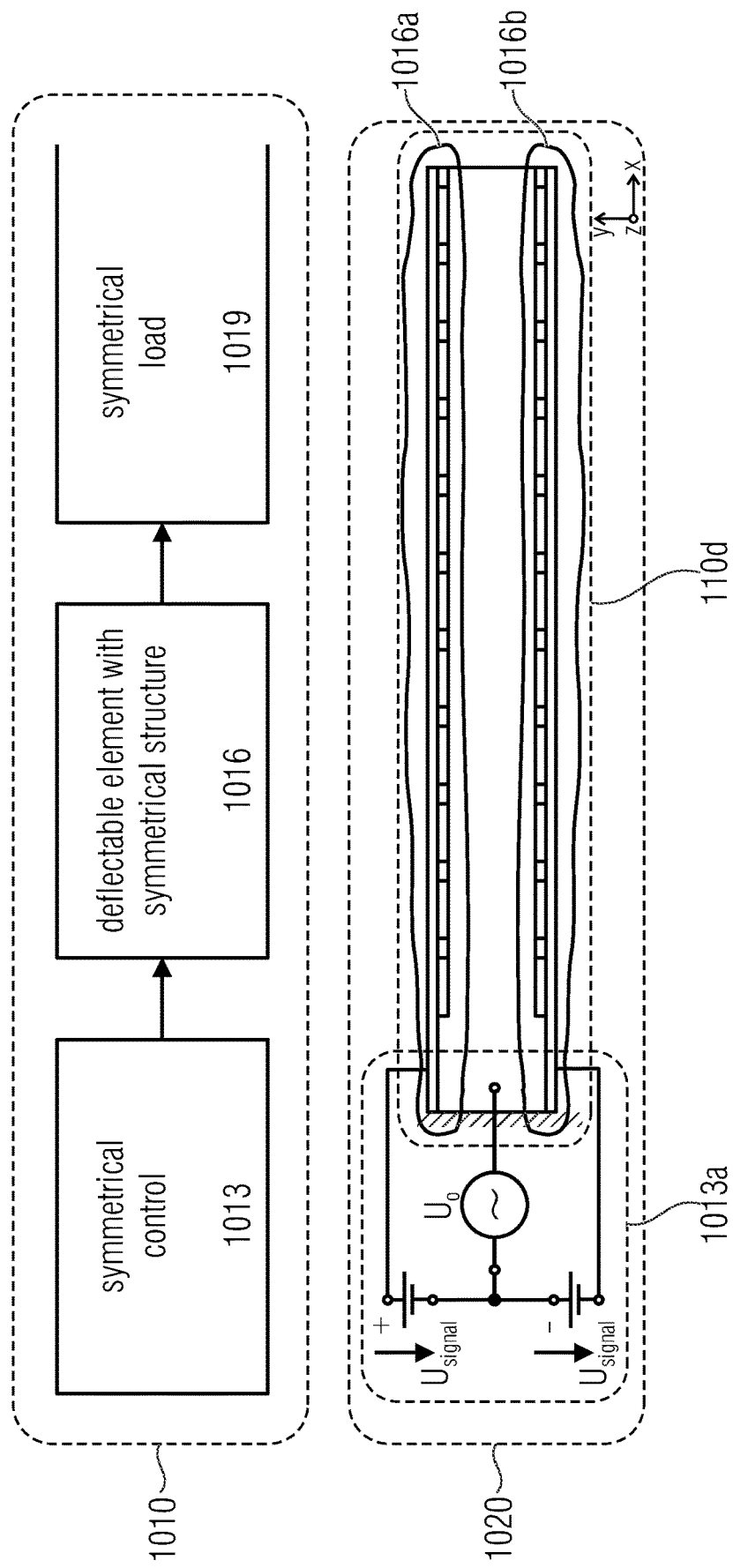
FIG. 7a is a block diagram of a symmetrical overall system and a schematic representation of an embodiment.

A corresponding embodiment 1020 and a block diagram 1010 for the case of a symmetrical load 1019 is shown in FIG. 7a. The block diagram 1010 consists of the following three blocks: symmetrical control 1013, symmetrical MEMS transducer 1016 and symmetrical load 1019. The embodiment 1020 illustrates a symmetrical deflectable element 110n with symmetrical MEMS transducers 1016a, 1016b and a symmetrical control 1013a consisting of two concatenated network loops. The symmetry should be configured such that the transmission characteristics of the overall system, consisting of control, MEMS transducer and load, complies with the symmetry principle, i.e. if the sign of the signal voltage is reversed, a deflection of the deformable element of essentially the same amount but with the opposite sign results.

This symmetry results in the suppression of mechanical even-order harmonics. For the electrostatic transducers considered herein, the amplitude of the third harmonic is smaller than the amplitude of the second harmonic. Symmetry thus also reduces the amplitude of third-order harmonics. Overall, this means a low harmonic distortion (THD), i.e. a significantly improved linearity.

Figure 7B:
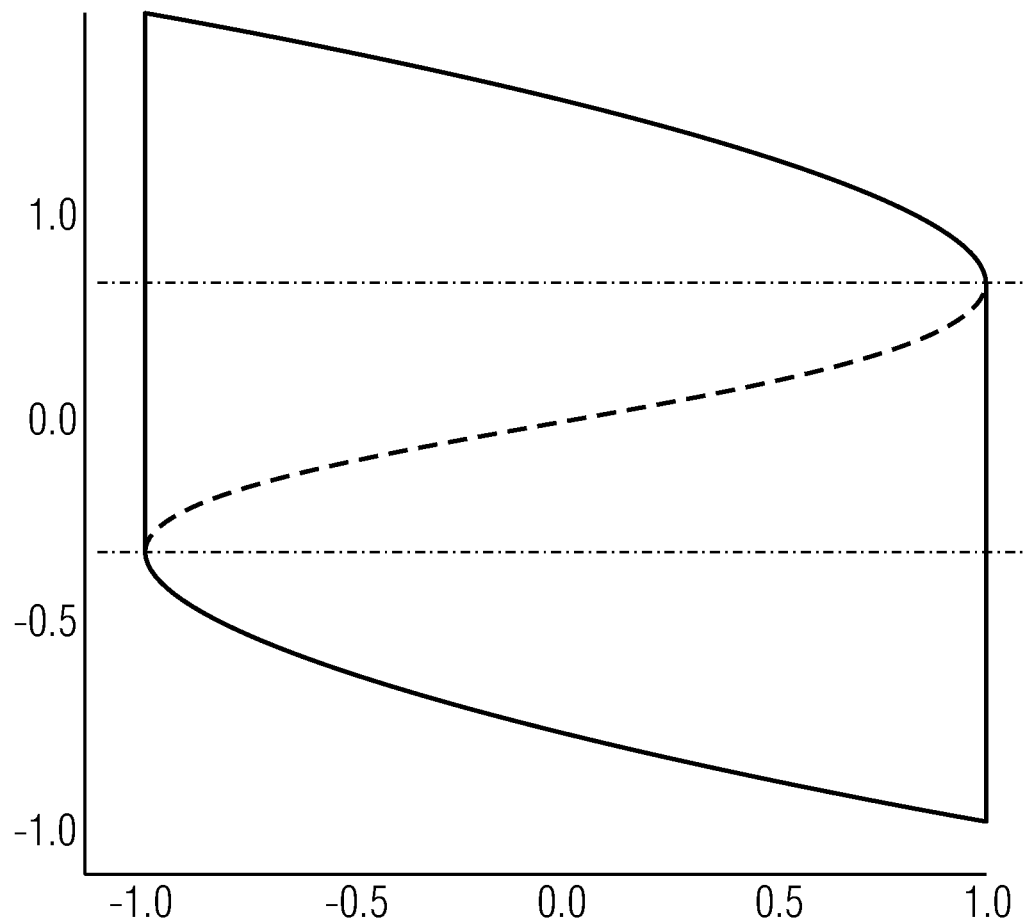

FIG. 7b shows the transmission characteristic of the embodiment shown in FIG. 7a. For practical operation, the dashed branch of the curve shown is relevant. The principle of symmetry is therefore fulfilled by this embodiment.

Figure 8:
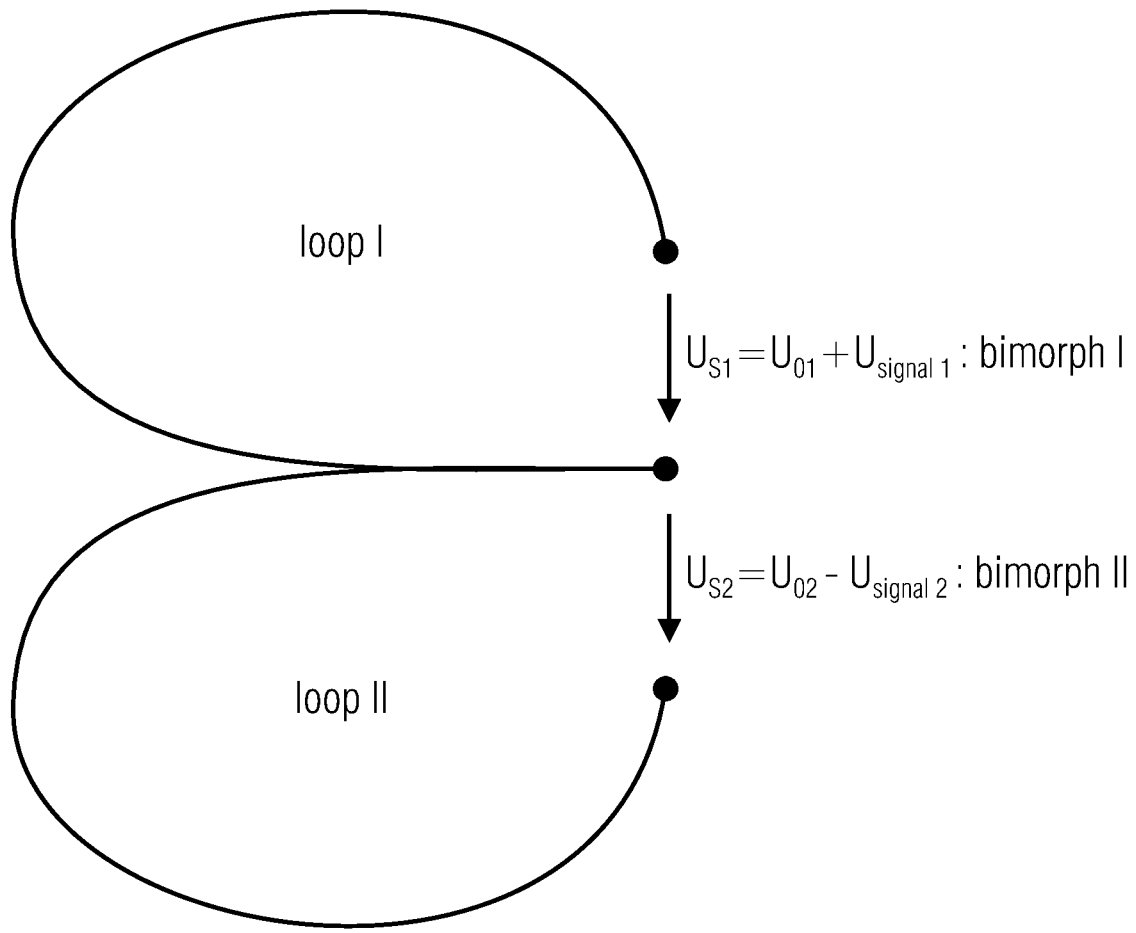
FIG. 8 is a schematic representation of the abstract principle of control.

The symmetrical control 1013a uses the abstract principle presented in FIG. 8. The control 1013a in FIG. 7a is illustrated in FIG. 8 as two loops, loop I, loop II. Loop I is coupled to the first MEMS transducer 1016a or bimorph I and loop II is coupled to the second MEMS transducer 1016b or bimorph II. The first and second electrical signal of loop I and loop II, respectively, has a concatenated network loop with a bias $U_{01}$ or $U_{02}$ and a signal voltage $U_{signal1}$ or $U_{signal2}$. In the case of symmetry, the biases $U_{01}$ and $U_{02}$ of loop I and loop II, respectively, are equal and the signal voltages $U_{signal1}$ and $U_{signal2}$ of loop I and loop II, respectively, are equal in amount, but operate with opposite signs.

The following examples use the above findings and considerations and are able to provide an improved linearity of the transmission characteristics with low voltage requirements and high performance.

Figure 9:
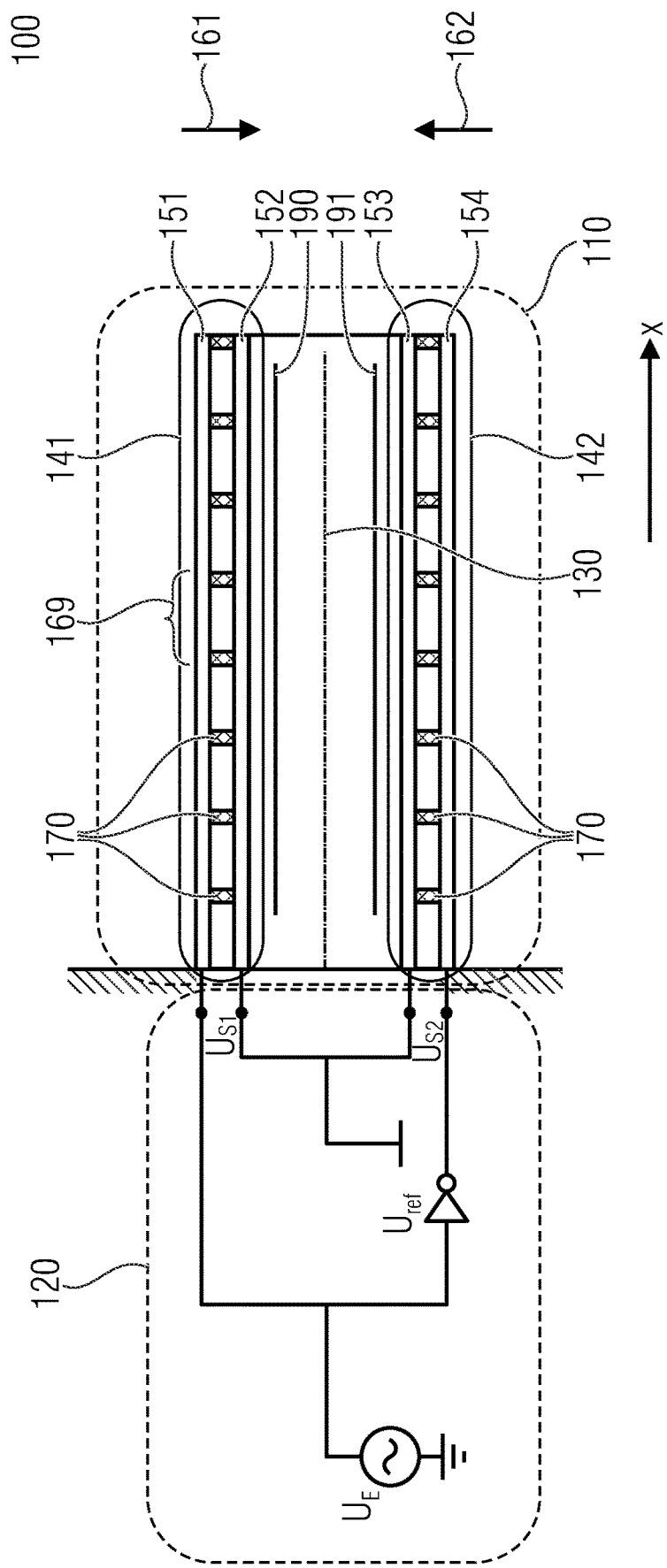
FIG. 9 is a schematic representation of a bending transducer as actuator.

FIG. 9 shows a bending transducer operated as actuator. The same is shown with reference number 100. The bending transducer 100 comprises a deflectable element 110, as illustrated in more detail in FIG. 6, and an electric control 120, which uses the principle presented in FIG. 8. The deflectable element 110 comprises a first MEMS transducer 141 spaced apart from and extending along a centroid fiber 130 of the deflectable element 110 and a second MEMS transducer 142 spaced apart from and extending along the centroid fiber 130. The centroid fiber 130 defines all points at which the deflectable element 110 has the centroid in cutting planes transverse to the longitudinal direction x. In other words, the centroid fiber defines a path in the member that consists of or connects a number of points resulting from centroids of a plurality of successive cross-sectional areas of the deflectable element. In addition, the examples 190 and 191 show two fibers spaced apart in opposite directions from the centroid fiber 130. When a first electrical signal, in the example of FIG. 9 of voltage $U_{s1}$, is applied to the MEMS transducer 141, the deflectable element 110 is deflected in a first direction 161. Similarly, when a second electrical signal is applied, also illustrated here as voltage $U_{s2}$, to the MEMS transducer 142, the deflectable element 110 is deflected in a second direction 162 opposite to the first direction. In other words, when activated, the MEMS transducer 141 causes, by applying a voltage, a deflection in the direction 161 by a lateral strain of a fiber 190 of element 110 located in front of the centroid fiber 130 in the direction 161, and a simultaneous contraction of a fiber 191 located behind the centroid fiber 130 in the direction 161. This takes place by the phase shift in the control in a first time interval described later. In a second time interval, the other MEMS transducer, namely 142, when activated, cause, by applying a voltage, the deflection of the element 110 in the direction 162 with lateral strain of the fiber 191 and contraction of the fiber 190. Here, as an example, the case is shown of strain occurring upon application of the corresponding signal to the respective MEMS transducer 141, 142, but the other case is also possible. As illustrated in FIG. 9, the first and second MEMS transducers 141, 142 may each be designed as a plate capacitor segmented along a longitudinal direction x of the deflectable element 130 according to the embodiments of the present application. The electrodes 151 to 154 of the respective plate capacitor 141, 142 are fixed insulated against each other between the segments 169 at the segment boundaries 170. A spacer layer located between electrodes 151 to 154 of the respective plate capacitor 141, 142 can be provided and structured laterally to form spacers at the segment boundaries 170, which fix the electrodes of the respective MEMS transducer against each other. If a voltage is applied between electrodes 151 and 152 or between 153 and 154, a strain or, alternatively, with a specific configuration of the segments, a contraction and thus the described deflection results. Further details can be found in WO2012095185.

The electrical control 120 is adapted to vary the first electrical signal $U_{s1}$ and the second electrical signal $U_{s2}$ depending on an input signal UE, so that a change of the first electrical signal $U_{s1}$ and a change of the second electrical signal $U_{s2}$ depends on the electrical input signal UE, and the phases of the first and second electrical signals $U_{s1}$, $U_{s2}$ are shifted relative to each other, such as being in phase opposition by 180° or phase-shifted by a phase shift between 0.001°-240°, both inclusive, or between 60°-200°.

By the possibility of a symmetrical configuration of the deformable element 110, so that, for example, the centroid fiber 130 forms a plane of symmetry of the same, and a symmetrical control, as it was illustrated in relation to FIG. 7a, it is possible, in interaction with a symmetrical electrical control, to achieve a high efficiency with at the same time high linearity. In the following, measures are described which will further improve the achievement of this goal.

Figure 10:
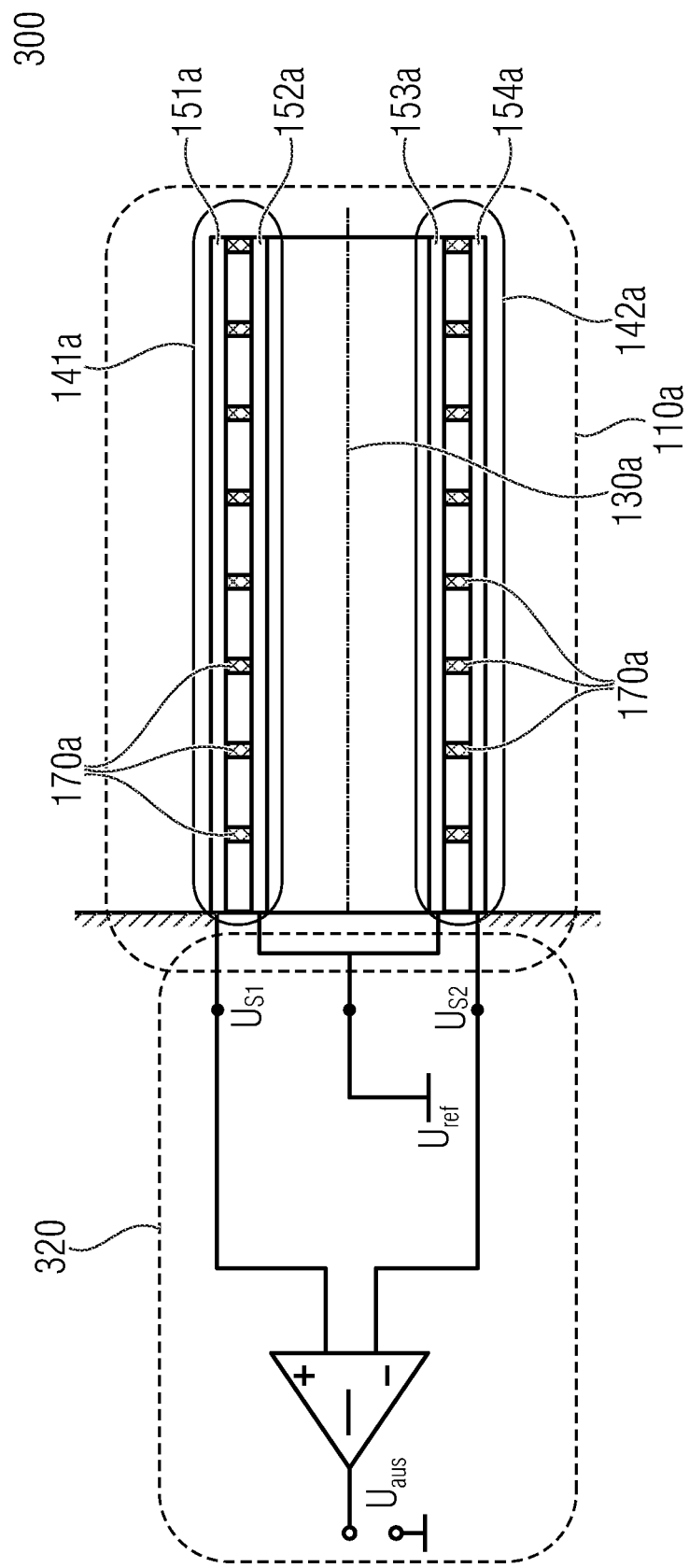
FIG. 10 is a schematic representation of a bending transducer as a sensor.

FIG. 10 shows a bending transducer 300 operated as sensor with a deflectable element 110a, as illustrated in FIG. 6, and an electrical circuit 320 using the principle presented in FIG. 8. The deflectable element 110a of the bending transducer 300 can be constructed like the deflectable element 110 of the bending transducer 100 in FIG. 9, which is used as actuator, which is why reference is made to the description of FIG. 9 and the same reference numbers are used. A deformation of the deflectable element 110a can be determined at the first or second MEMS transducer 141a, 142a by means of a first or second electrical signal, here again illustrated as voltages $U_{s1}$, $U_{s2}$. In the case of the MEMS transducers 141a, 142a being configured as plate capacitors, the signals are generated, for example, as voltages at the electrodes of the same. The electrical circuit 320 is configured to generate an output signal $U_{out}$ from the first electrical signal $U_{s1}$ and the second electrical signal $U_{s2}$, so that a change of the output signal $U_{out}$ depends on a difference in a change of the first electrical signal and a change in the second electrical signal $U_{s1}$, $U_{s2}$. As in FIG. 9, the possibility of a symmetrical configuration of the deformable element 110, so that, for example, the centroid fiber 130 forms a plane of symmetry of the same, and a symmetrical electrical pre-connection 1013a, as illustrated in relation to FIG. 7a, enables a high performance with high linearity at the same time. In the following, measures are described which improve the achievement of this goal also in the present case of operating the bending transducer as sensor.

Without this being pointed out specifically in the following description, it should be mentioned that the deflectable elements 110 or 110a can be cantilevered elements, e.g. cantilevered beams, with the clamping at one end of the deflectable element along the aforementioned segmentation direction x. In the figures, the clamping is sometimes indicated by hatching on the left.

Figure 11:
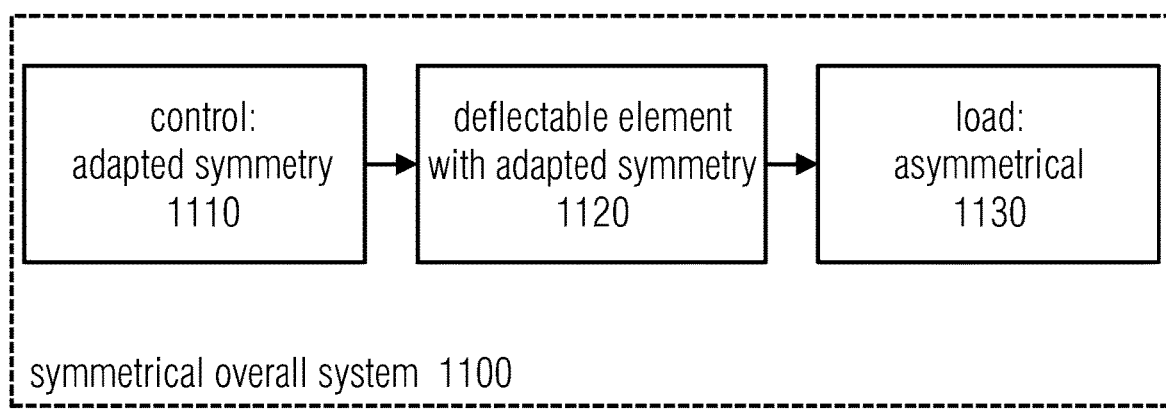
FIG. 11 is a block diagram of a load adjustment.

When used as intended, the deformable elements 110, 110a of a bending transducer are subject to external forces or an external load, which may themselves be asymmetrical with respect to the direction of movement of the deformable elements, such as by their own weight or in the case of a piston movement in a micropump. FIG. 11 shows a block diagram of a symmetrical overall system 1100 with an asymmetrical load 1130. The block diagram of the symmetrical overall system 1100 comprises the three following blocks: Control with adapted symmetry 1110, deformable element with adapted symmetry 1120, asymmetrical load 1130.

The needed symmetry of the overall system consisting of control 120, deformable element 110,110a, disclosed in FIG. 9, and load can be achieved by specific adaptation of the transducer configuration and/or adaptation of its electrical control to the asymmetrical load 1130. The symmetry of the individual parts of the overall system, as indicated in FIG. 7a, is not needed. The symmetry of the bending transducer can be achieved by an asymmetrical bimorph structure of the bending transducer adapted to the asymmetrical load 1130 (FIG. 11), i.e. a symmetry of the element 110, 110a in FIGS. 9 and 10, for example. The symmetry adaptation of the bimorph structure 141, 141a, 142, 142a can be achieved by varying the electrode thickness or the electrode spacing between both sides of the symmetry line of the deformable element 110, 110a, among other things. An example of this is disclosed in FIG. 22. However, the symmetry adaptation can also take place by adapting the control 120 or the circuit 320 (FIG. 10), for example by introducing compensating electrical impedances in loop I or loop II or the respective part of the control allocated to the MEMS transducer 141, 141a, 142,142a. Finally, the effective spring stiffness k' of the deformable element 110,110a changes with respect to its mechanical spring stiffness k with the level of the fixed voltage $U_0$.

$$k' = k\left(1 - \left(\frac{U_0}{U_{max}}\right)^2\right)$$

The system can therefore be adapted to an asymmetrical load 1130 by selecting different fixed voltages $U_{01}$ and $U_{02}$ in loop I and loop II, i.e. by applying different biases to the MEMS transducer unit 141 and 142 by the control 120 in the case of FIG. 9 or the provision of different biases by the electrical circuit 320 in the case of FIG. 10. The measures for symmetry adaptation at the level of control and deflectable element 110,110a can be configured such that the symmetry principle for the overall system is fulfilled within practically relevant limits.

In other words, in FIGS. 9 and 10, the electrical circuit 320 and the control 120, respectively, may be configured to operate the MEMS transducer 141/141a and/or the MEMS transducer 142/142a with a differing bias to compensate for the asymmetry of the load in order to compensate an asymmetrical load on the deflectable element 110/110a, e.g. resulting from the operation and being constant. If, for example, the asymmetrical load causes a deflection of the deflectable element in the resting position in the direction 162, the MEMS transducer which causes a deflection in the opposite direction is operated with a higher bias.

Figure 12:
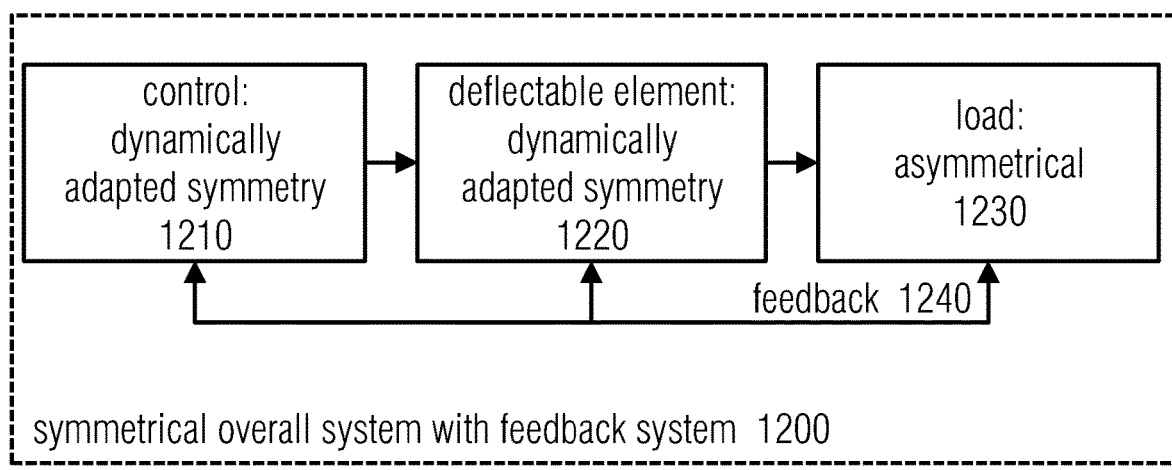
FIG. 12 is a block diagram of a dynamic load adjustment.

The adaptation of the transducer symmetry and/or the adaptation of its electrical control 120 and circuit 320, respectively, to an asymmetrical load 1130 can also be achieved dynamically, i.e. during operation with alternating loads, by means of suitable sensors and a feedback system, in contrast to FIG. 11. By means of active network components, such as transistors, operational amplifiers, etc., the relevant electrical network parameters, such as impedances, voltages, currents, are adjusted to the respective load situation. FIG. 12 shows a block diagram of the symmetrical overall system with a feedback system 1200. The block diagram shows three successive blocks and one feedback system 1240. The three blocks are: a control with dynamically adapted symmetry 1210, a deformable element with dynamically adapted symmetry 1220, and an asymmetrical load 1230. The feedback 1240 links the asymmetrical load 1230 to the deformable element 1220 and to the control 1210.

In other words, it may be the case that the asymmetrical load on the deflectable element 110/110a in FIGS. 9 and 10 is measured. The measurement can take place externally and be fed to control 120 or to the electrical circuit 320, so that the latter adjusts the bias for the MEMS transducer 141/141a and/or the MEMS transducer 142/142a or the difference between the two biases accordingly. The measurement of the asymmetrical load can also be performed by an internal sensor. The control 120 or the electrical circuit 320 can itself detect the asymmetrical load on the deflectable element via mechanical-to-electrical conversion of the MEMS transducer 141/142.

An important aspect is that with the symmetry-induced suppression of even-order harmonics, a dynamically caused shift of the resting position or operating point can be prevented. Such a dynamic shift of the operating point would otherwise change the system characteristics depending on the spectral composition of the input signal or stimulus when used as actuator or sensor, and is therefore particularly disadvantageous.

By increasing the linearity of the system, the occurrence of subharmonic resonances is also suppressed. Subharmonic resonances occur regularly when controlling 120 the non-linear bending transducers 100 operated as actuators with broadband signals. They limit the technically usable frequency range to a fraction of the resonance frequency, typically 1/2, 1/3, 1/5 etc., since the output of the control electronics 120 is practically short-circuited when passing through the same on the frequency axis. Subharmonic resonances can usually only be imperfectly reduced by active feedback systems 1200, since the cross-modulation phenomenon also occurs with non-linearity. In addition, active feedback systems 1200 increase the system costs. Suppression of subharmonic resonances by increasing system damping or power dissipation unnecessarily reduces drive efficiency and is particularly disadvantageous for mobile applications. In contrast, the linearization of the deformable element is particularly advantageous.

A further aspect is the finding that the sensitivity, i.e. the steepness of its transfer function, can be adjusted by changing the fixed voltage $U_0$ using the design of control 120 and electrical circuit 320 and MEMS transducer 141, 141a, 142, 142a. The sensitivity is proportional to the square of the fixed voltage $U_0$:

$$\text{sensitivity} \propto (U_0)^2$$

Consequently, for example, by increasing the fixed voltage $U_0$, the amplitude of the signal voltage $U_{signal}$ needed to achieve the maximum deflection can be reduced without any significant loss of linearity.

This aspect is important for the use of the bending transducer 300 as actuator 100 because the electrical reactive power needed for operation is proportional to the square of the signal voltage $U_{signal}$ and can be greatly reduced by increasing the bias $U_0$.

$$\text{reactive power} \propto (U_{signal})^2$$

High reactive power consumption generates high electrical losses in the control electronics 120 and is not compatible with the use of the bending transducer in mobile applications. Compared to conventional technology, such as capacitive, magnetic or piezoelectric actuators, this aspect is a definite advantage.

This aspect is important for the use of the bending transducer as a sensor, because the sensitivity of the sensor can be greatly increased and, for example, the signal-to-noise ratio of a microphone realized with this bending transducer can be significantly improved.

This aspect is important both for the use of the bending transducer as actuator and as sensor, because with a favorable selection of the signal voltage amplitude, the costs for the needed control electronics 120 or circuit 320 can be significantly reduced. For example, the production of CMOS electronics for voltages <12 V is particularly cost-effective. Signal voltages <5V meet the TTL standard widely used for low-cost electronic components. Signal voltages <1.3 V can be controlled directly, i.e. without additional driver circuitry, by the electrical outputs of modern signal processors.

The sensitivity, i.e. tangent slope of the transfer function at zero, of the deformable element 110,110a can be improved by design measures. The decisive factor here is that the sensitivity is proportional to the ratio of the maximum electrostatic energy depositable in the bimorph structures 141, 141a, 142, 142a to the energy of elastic deformation deposited in the deformable element 110, 110a at maximum deflection:

$$\text{sensitivity} \propto \frac{\text{max.electrostatic energy of the bimorph structures}}{\text{max.elastic energy dof the deformable elements}}$$

This allows the sensitivity of the bending transducer (ceteris paribus) to be increased by increasing the maximum electrostatic energy depositable in the bimorph structures 141, 141a, 142, 142a and/or by reducing the deformation energy needed for the maximum deflection. Accordingly, the fixed voltage $U_0$ needed for adjusting a certain sensitivity can be lowered.

The maximum electrostatic energy depositable in the bimorph structures 141, 141a, 142, 142a can be increased by a skillfully chosen electrode geometry and arrangement. For example, an interdigital arrangement in the form of a comb structure, as shown in FIG. 19c, can be arranged between the electrodes. In particular, FIG. 19c shows how projections of electrodes 151 and 152 of the MEMS transducer 141 (a) interlock, increasing capacity and thus also depositable electrostatic energy. The same is shown also for the other MEMS transducer 142/142a.

It is also possible that the maximum elastic energy depositable in the deformable elements 110/110a can be reduced by a skillfully chosen mechanical design.

For example, according to the principle of the supporting structure, the solid volume deformed during deflection can be minimized.

For bending transducers 100, 300, where the deformable element 110,110a is a cantilevered beam and whose intended direction of movement is in the wafer plane, the maximum beam length and thus the lowest possible resonance frequency is limited by the vertical pull-in. While the spring stiffness of the deformable element 110,110a perpendicular to the direction of movement is decisive for the vertical pull-in, the spring stiffness in the direction of movement is decisive for the resonance frequency. The relationship between effective spring stiffness and fixed voltage $U_0$ described above applies primarily to spring stiffness in the direction of movement. This finding makes it possible to further reduce the lowest possible resonance frequency of a given deformable element 110,110a by increasing the fixed voltage with respect to the mechanically determined limit.

The effective spring stiffness k' of the deformable element 110,110a can be lowered with respect to the mechanical spring stiffness k by means of the fixed voltage $U_0$:

$$k' = k\left(1 - \left(\frac{U_0}{U_{max}}\right)^2\right)$$

With this knowledge, electronically variable bending transducers 100/300 or bending transducer systems can be realized where the resonance frequency or the dynamic behavior can be adjusted below the resonance frequency via the fixed voltage $U_0$ depending on the application situation.

In the following, some embodiments, which are based on a cooperation of several bending transducers, will be described.

Figure 13:
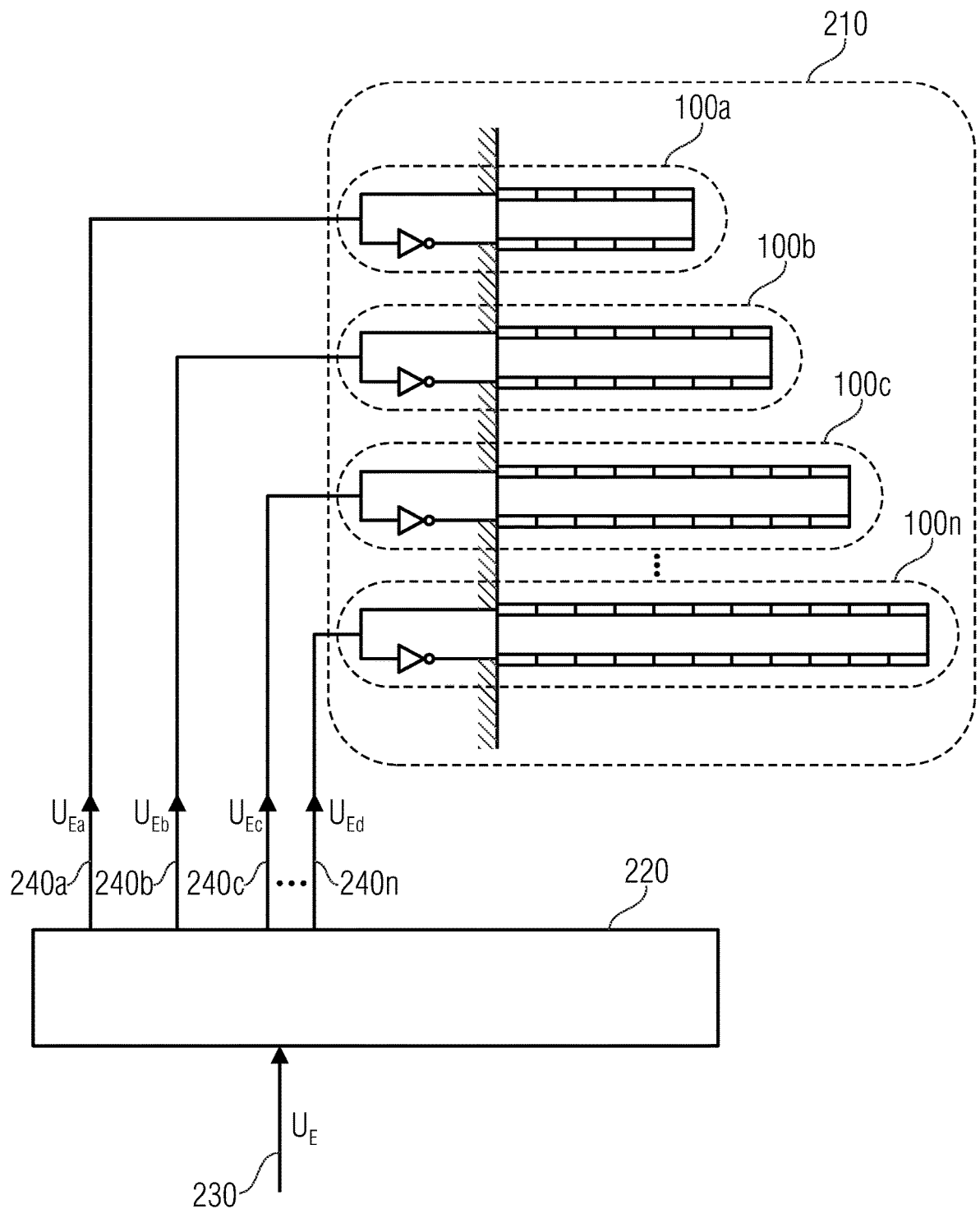
FIG. 13 is a schematic representation of a bending transducer system with a spectral splitting circuit.

FIG. 13 shows a bending transducer system 210 comprising a plurality of bending transducers 100a-n and a splitting circuit 220. The number n can be two or more. Each of the plurality of bending transducers 100a-n is used as actuator and is constructed as described in FIG. 9, but differs in spectral efficiency and sensitivity. This can be achieved as described below: In FIG. 13, it is indicated that the mutual spectrally different efficiency is achieved by mutually different dimensioning of the deflectable element. The splitting circuit 220 is individually coupled to the bending transducers 100a-n and is adapted to spectrally split a total input signal UE 230 into a plurality of input signals $U_{Ea}$-$U_{Ed}$ 240a-n for the plurality of bending transducers 100a-n, such that each bending transducer 100a-n receives a spectral portion of the input signal 230 for which its sensitivity and linearity is high, or is suitable for the frequency band associated with the respective bending transducer. The splitting circuit is optional and could also be emitted. The linearity can be increased by using several 100a-n bending transducers as illustrated in FIG. 13. The mechanical effect of the 100a-n bending transducers adds up, so that the individual bending transducers of the arrangement can only be operated in a fraction of the dynamic range or deflection. A single bending transducer with a comparable effect, i.e. an arrangement with only one deformable element and with the same efficiency, would need a high degree of precision and measures to enable the same linearity.

Figure 14:
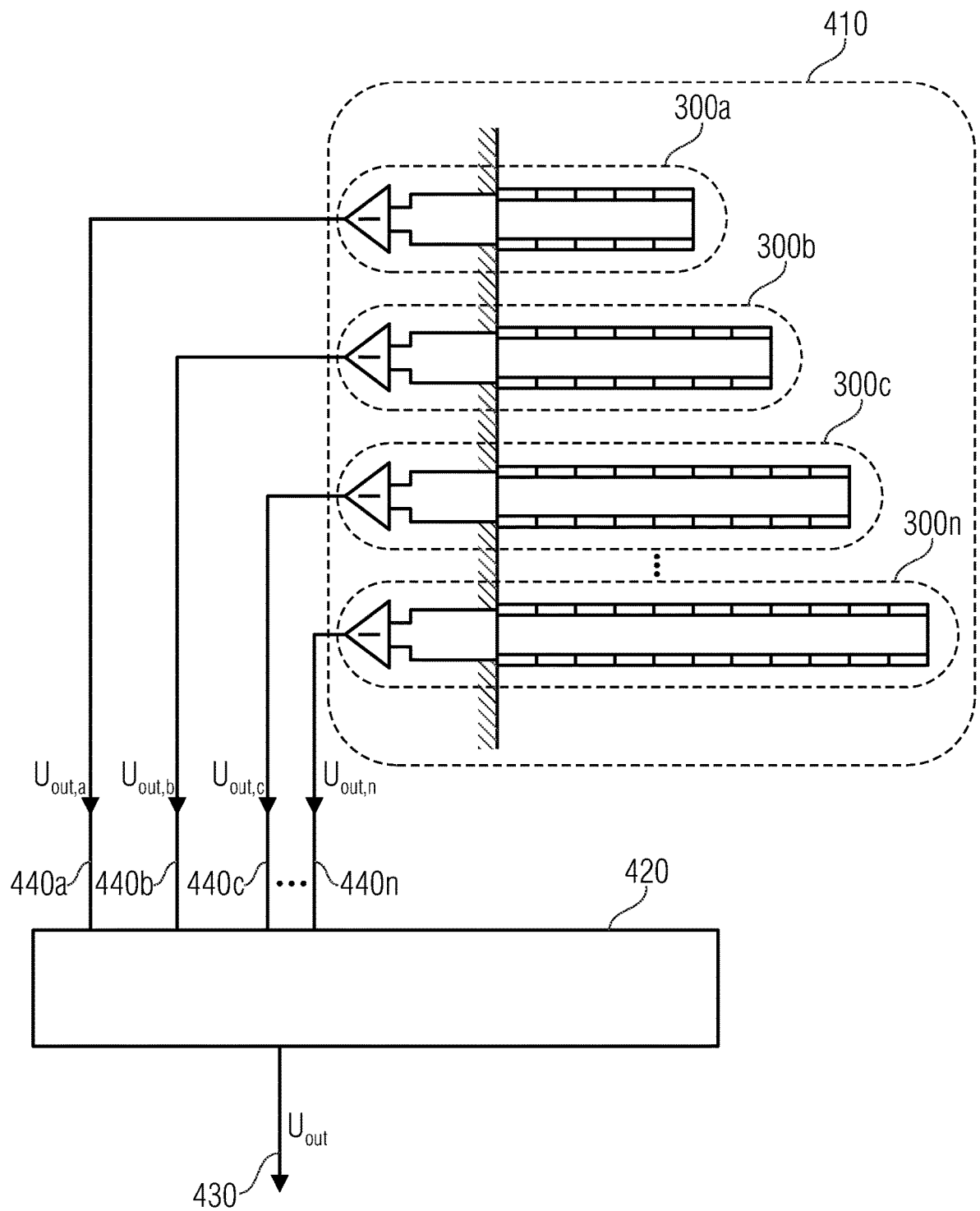
FIG. 14 is a schematic representation of a bending transducer system with a spectral combination circuit.

FIG. 14 shows abending transducer system 410 with a plurality of bending transducers 300a-n and a circuit 420. The number n can be two or more. The bending transducers 300a-n, each of which is operated as sensor, are constructed in the same way as the bending transducer in FIG. 10. The circuit 420 is coupled to the bending transducers 300a-n to spectrally assemble a total output signal $U_{out}$ from a plurality of output signals $U_{out,a}$-$U_{out,n}$, of the plurality of bending transducers 300a-n. As in FIG. 13, the bending transducers differ from each other with respect to their spectral efficiency or sensitivity, which, as indicated in FIG. 14, can be realized by the fact that the same are dimensioned differently from each other. Since each bending transducer 100a-n is configured for a specific spectral portion or frequency band for which its sensitivity and linearity are high, linearity can be increased whereby the effect of the bending transducers is added. A single bending transducer with a comparable effect, i.e. an arrangement with only one deformable element and with the same efficiency, would need a high degree of precision and measures to enable the same linearity.

Figure 15:
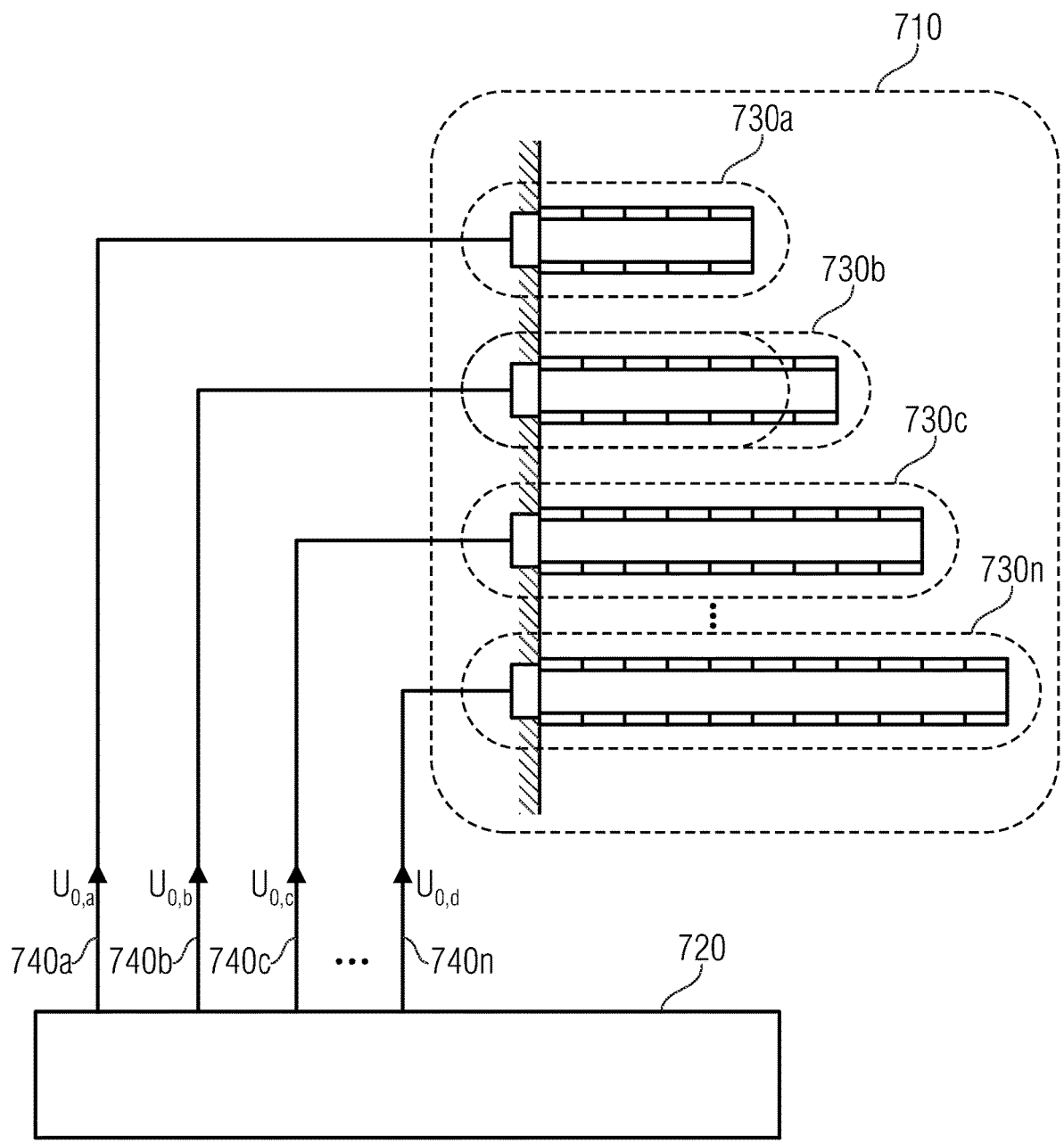
FIG. 15 is a schematic representation of a bending transducer system with bias adjustment.

FIG. 15 shows a bending transducer system having a plurality of bending transducers 730a-n and a circuit for a bias adjustment, namely 720. The bending transducers are indicated in FIG. 15 with reference number 730a-n to indicate that they may be those used as actuators, such as the bending transducers 100a-n of FIG. 13, or bending transducers which are operated as sensors, such as the bending transducers 300a-n of FIG. 14. Unlike FIGS. 13 and 14, the bending transducers 730a-n of FIG. 15 are shown in such a way that they do not differ in their dimensions. Nevertheless, it is possible to vary the spectral efficiency or sensitivity of the bending transducers 730a-n. This is done by the bias adjustment circuit 720. The same is able to individually adjust the aforementioned biases with which the MEMS transducers are operated in the deflectable elements of the bending transducers 730a-n. This adjustment in turn allows the spectral efficiency or sensitivity of the bending transducers 730a-n to be individualized or made responsible for different frequency bands. For example, the bias adjustment circuit 720 could be used in addition to the frequency decomposition circuit 220 or in addition to the composition circuit 400 also in the systems of FIGS. 13 and 14 in order to carry out fine adjustment of the bending transducers there. Conversely, a circuit 220/420 could also be provided in FIG. 15.

Figure 16:
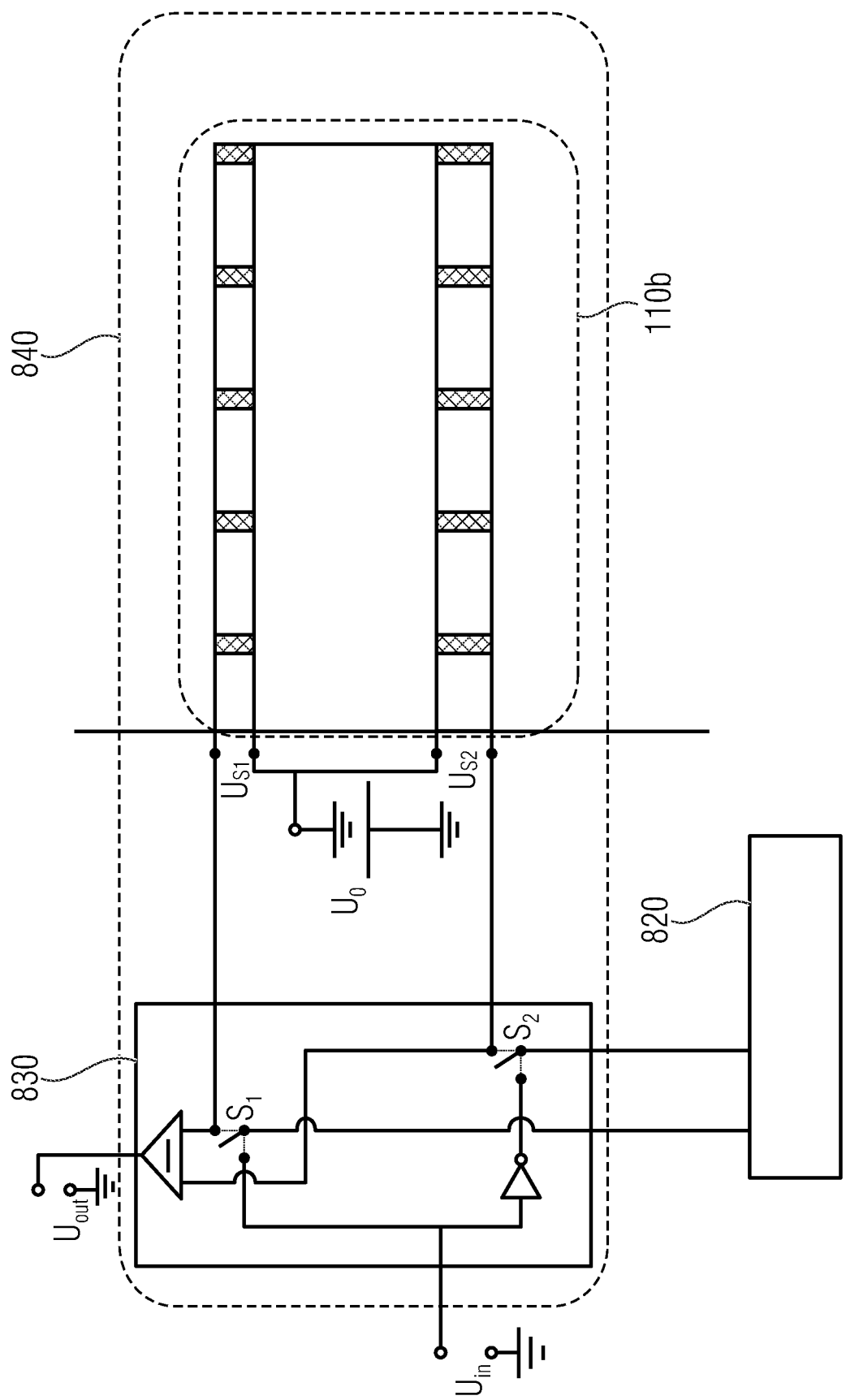
FIG. 16 is a schematic representation of a bending transducer which can be operated as actuator and/or as sensor with a circuit which is configured to operate the bending transducer as actuator and/or as sensor.

It is possible to provide a bending transducer which can be operated either as sensor or actuator. FIG. 16 shows such a bending transducer 840. The bending transducer 840, which can be operated as sensor and/or as actuator, is provided with a circuit 820, which is configured to operate the bending transducer 840 as sensor and/or as actuator. The bending transducer comprises a deflectable element 110b which is structured like the deflectable element 110 in FIG. 9 and/or the deflectable element 110a in FIG. 10, and an electrical circuit 830 which is configured to vary either the first and the second electrical signal $U_{s1}$, $U_{s2}$ depending on an input signal $U_{in}$ or to generate an output signal $U_{out}$ from the first and from the second electrical signals $U_{s1}$, $U_{s2}$. The circuit 820 is coupled with the circuit 830 and is configured to operate the bending transducer 840 as sensor and/or as actuator.

Figure 17:
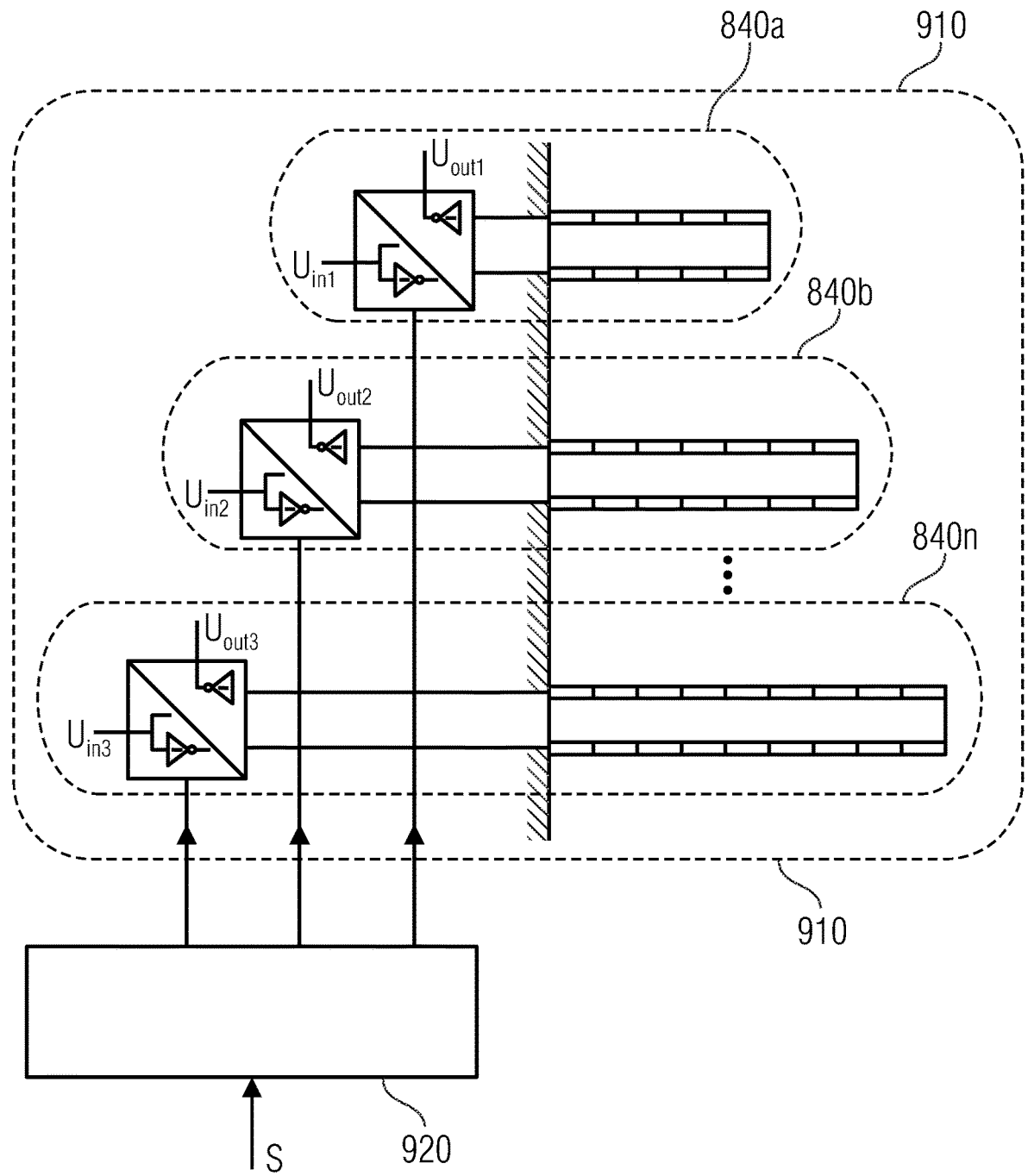
FIG. 17 is a schematic representation of a bending transducer system comprising a circuit configured to operate the bending transducer individually as actuator and/or as sensor.

Even those bending transducers that have not yet been defined with regard to their use as actuator or sensor, as one described representatively in FIG. 16, can be combined into one system. FIG. 17 shows such a system.

FIG. 17 shows a bending transducer system 910 and a circuit 920. The bending transducer system comprises a plurality of bending transducers 840a-n. The bending transducers 840a-n can be structured like the bending transducer 840 in FIG. 16 and can be operated as actuator and/or sensor. The circuit 920 is individually coupled to the bending transducers and is configured such that a first part of the total amount of bending transducers is selected as actuators and a second part of the total amount of bending transducers is selected as sensors, wherein the subset is distributed in dependence on a control signal S. In other words, the circuit 920 commands the circuit 830 of FIG. 16 either to take over the function as control circuit or the function as electrical circuit.

As already mentioned above, the presented systems consisting of several bending transducers are able to achieve improved linearity. The usage of several bending transducers takes place such that their mechanical effect adds up, so that the individual bending transducer of the respective arrangement or system, for example, only has to be operated in a fraction of the overall dynamic range of the system. An actuator of comparable geometry with an arrangement of only one deformable element and the same function would need higher precision and more measures.

Further embodiments of bending transducers and deflectable elements will be described below.

The structure of a device based on a bending transducer and operated as an actuator is shown once again in FIG. 18a-d based on a cantilevered beam. An insulating spacer layer 170' and an electrically conductive material 151 and 154 are applied on both sides of an electrically conductive beam 1201. For example, the insulating spacer layer 170' can be laterally structured by means of a sacrificial layer technology so that a thin cavity 1304 and 1404 is formed between electrodes 1201 and 151 or between electrodes 1201 and 154 in each of segments 169, into which the deflectable element is segmented along the longitudinal direction x, and insulating spacers 170 remain at the segment boundaries. The cavity has the thickness of the dielectric sacrificial layer and thus defines the plate spacing of the capacitor. If an electrical voltage is applied between electrodes 1201 and 151 or between electrodes 1201 and 154, the forces in the y-direction of the electrostatic field result in lateral strain on the surface of the beam in the x-direction. The beam 1201 is deflected as a result of the surface strain. If regular lateral geometries are used, the surface strain is approximately constant and a spherical deformation profile is created.

The electrical wiring is made in such a way that an electrical DC voltage $U_B$ is applied to the outer electrodes 151 and 154 and an AC signal voltage $U_S$, such as an audio signal, is applied to the middle electrode or beam. The outer electrodes 151 and 154 are provided with an electrical bias. The amplitude of the AC signal voltage $U_S$ is equal to or smaller than the electrical bias $U_B$. The highest electrical potential in the system is to be selected in an economically sensible manner and can comply with applicable directives and standards. Due to the electrical bias of the outer electrodes, the curvature of the beam follows the signal AC voltage $U_S$. A positive half-wave of the AC signal voltage $U_S$ leads to a curvature of the beam 1201 in negative y-direction. A negative half-wave leads to a curvature of the beam 1201 in positive y-direction. FIG. 18a-d show further variants of electrical contacting.

Figure 18A:
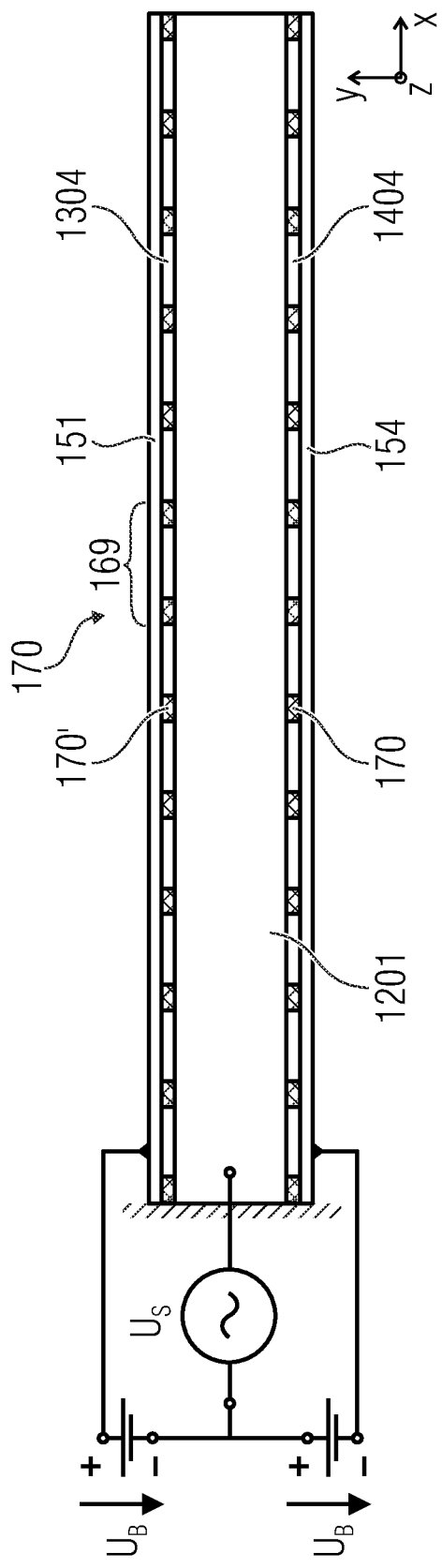
FIG. 18a is a schematic representation of a symmetrical electrostatic cantilever deflectable in two directions and cantilevered-electrical bias at the outer electrodes.
Figure 18B:
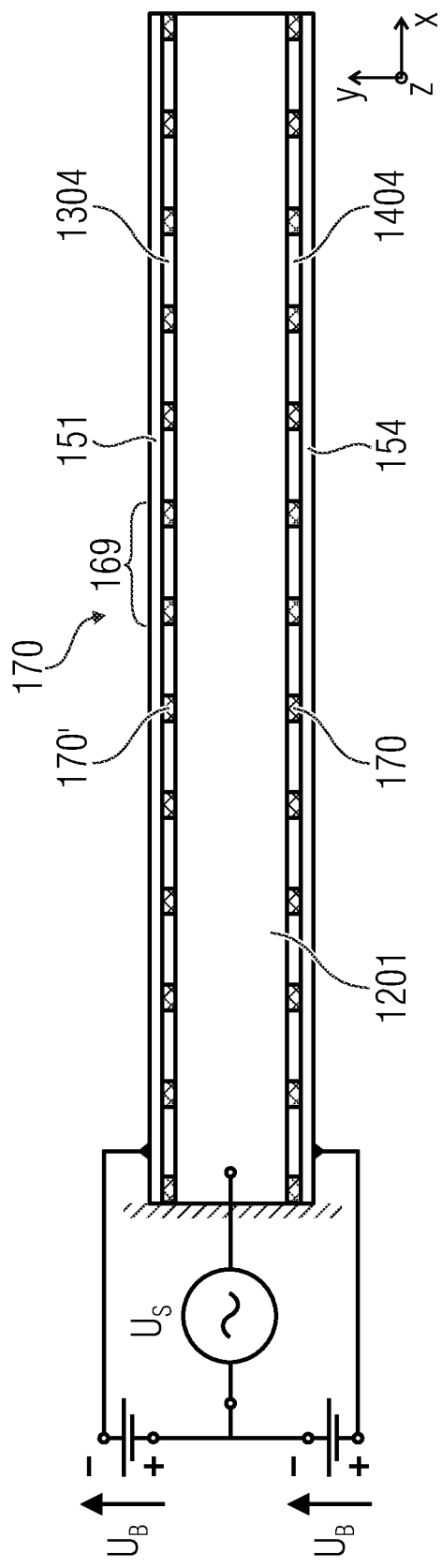
FIG. 18b is a schematic representation of a symmetrical electrostatic cantilever deflectable in two directions and cantilevered-electrical bias of the inner electrode(s)

FIG. 18a shows the respective outer electrodes provided with an electrical DC voltage, but compared to the FIG. 18b with an opposite electrical potential.

Figure 18C:
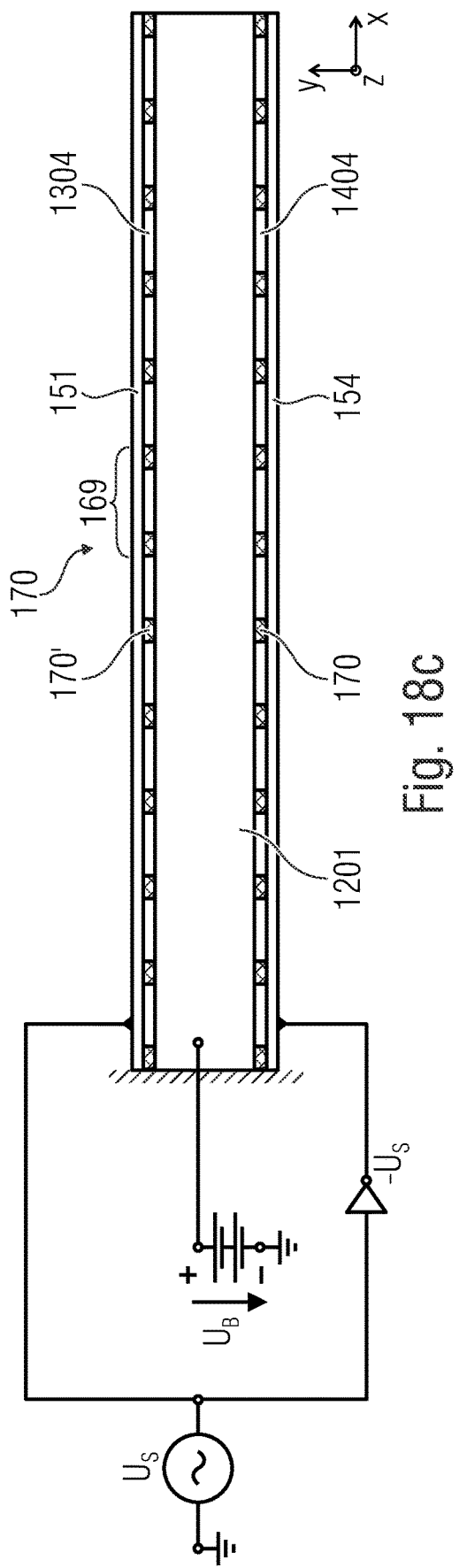
FIG. 18c is a schematic representation of a symmetrical electrostatic cantilever deflectable in two directions and cantilevered-electrical bias of the inner electrode(s)
Figure 18D:
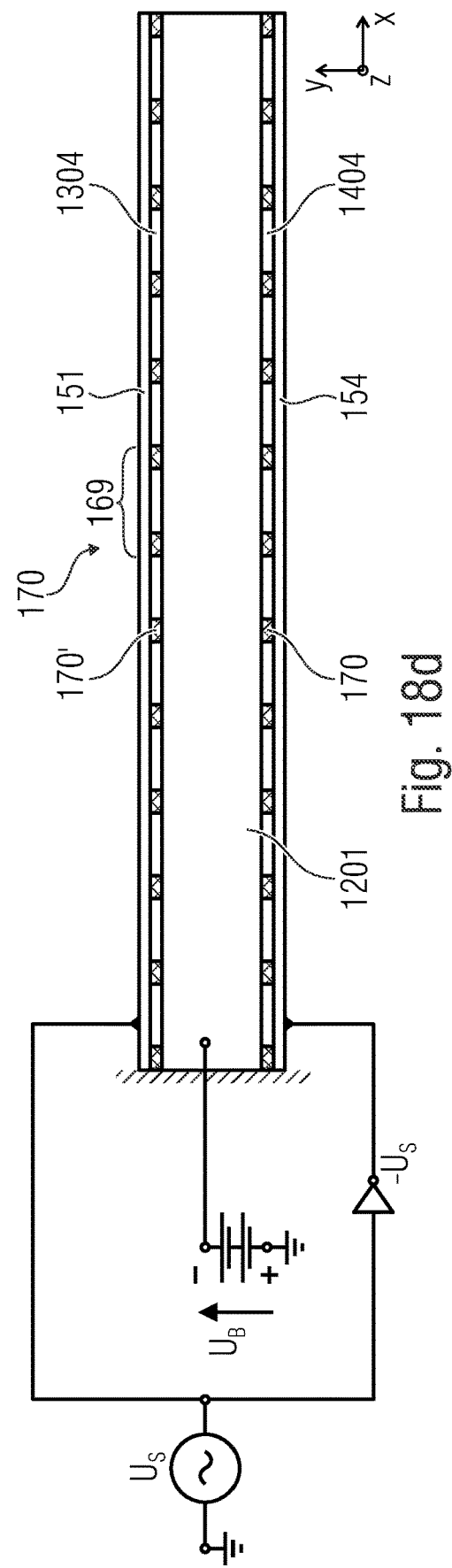
FIG. 18d is a schematic representation of a symmetrical electrostatic cantilever deflectable in two directions and cantilevered.

FIG. 18c and FIG. 18d show variants with an electrical bias of the inner electrode(s). The signal voltage is applied to the outer electrodes.

Instead of a bias electrically applied to the outer or inner electrode(s), a permanent polarization of the outer or inner electrode(s) as electret, e.g. silicon dioxide, is possible. Instead of the voltage sources shown in the previous figures, current sources can be used.

Figure 19A:
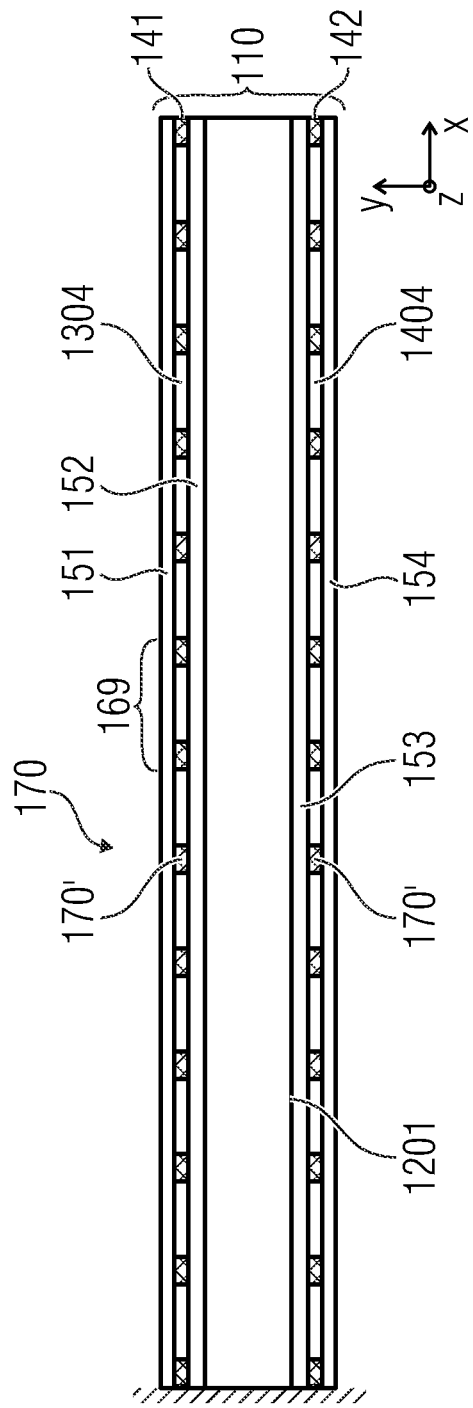
FIG. 19a is a schematic representation of the cross-section of an electrostatically deflectable and cantilevered cantilever with inner and outer electrodes.
Figure 19B:
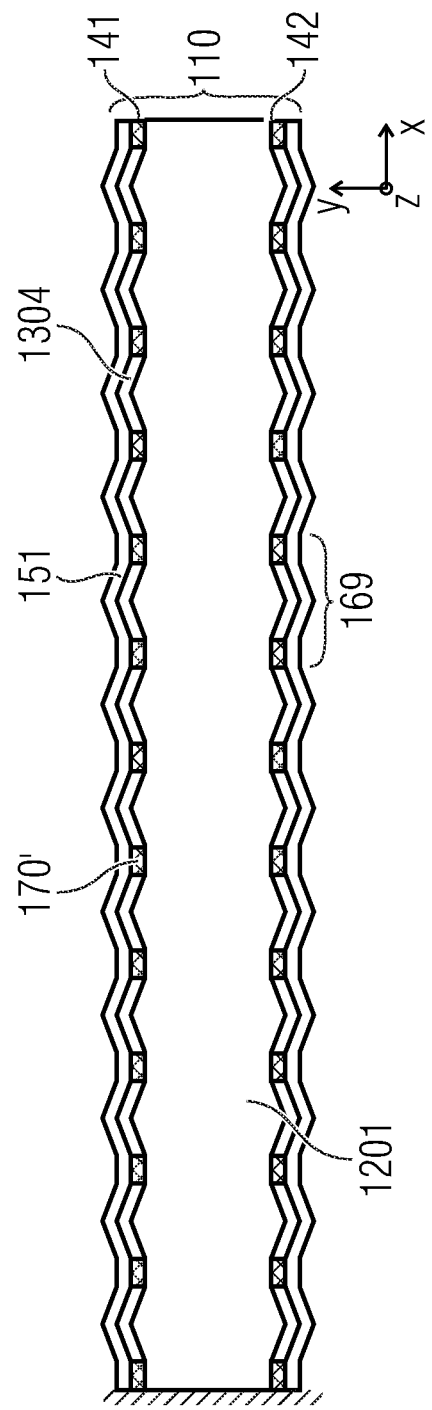
FIG. 19b is a schematic representation of the cross-section of an electrostatically deflectable and cantilevered cantilever with tilted electrodes.

FIG. 19a-c show further embodiments of the deflectable element or alternative topographies of the electrodes of the MEMS transducers, wherein the control is not shown for the sake of clarity. The reference numbers and the basic description of FIG. 18a-c continue to apply.

FIG. 18a-d illustrates that the element to be bent or the gro or the carrier 1201 itself can function as an electrode. FIG. 19a illustrates the possible configuration, according to which instead a separate proximal electrode of the respective plate capacitor is provided directly on the surface or the upper and lower sides of the support 1201 facing the plate capacitors. Here, 152 and 153 are the inner or proximal electrodes and 151 and 154 are the outer or distal electrodes.

The topography of the electrodes can be structured as shown schematically in FIG. 19b. In addition, differently shaped electrodes are possible, e.g. dome-shaped electrodes. In order to further increase the capacitor area and thus the depositable electrostatic energy, comb-shaped electrodes, as shown in FIG. 19c, are possible.

The element to be bent, e.g. beams, can be cantilevered or clamped on both sides.

FIGS. 20a-c and 21a-b show further possible embodiments of deflectable elements. In each of these figures half segments 169 are shown. The other half can each be shaped symmetrically. The bending transducer or the deflectable element consists of an e.g. even number of segments 169 formed in such a way successively in longitudinal direction x. In the illustrations only the topography is shown, without distinguishing between electrodes and insulating spacer layer.

Figure 20A:
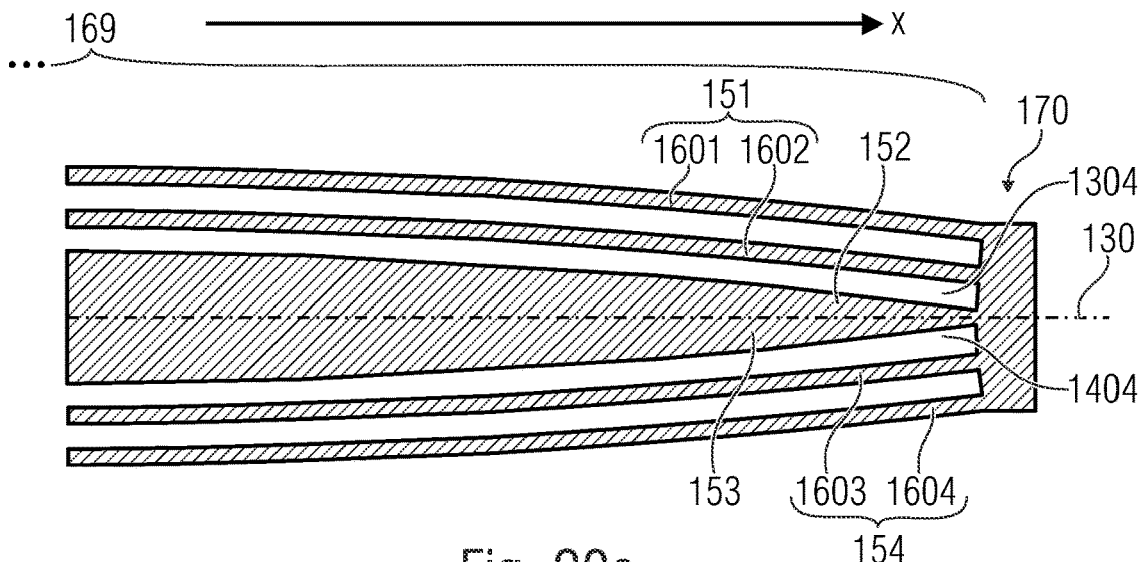
FIG. 20a is a schematic representation of a deflectable element, wherein only half a segment is shown, with multilayer electrode structure.
Figure 21A:
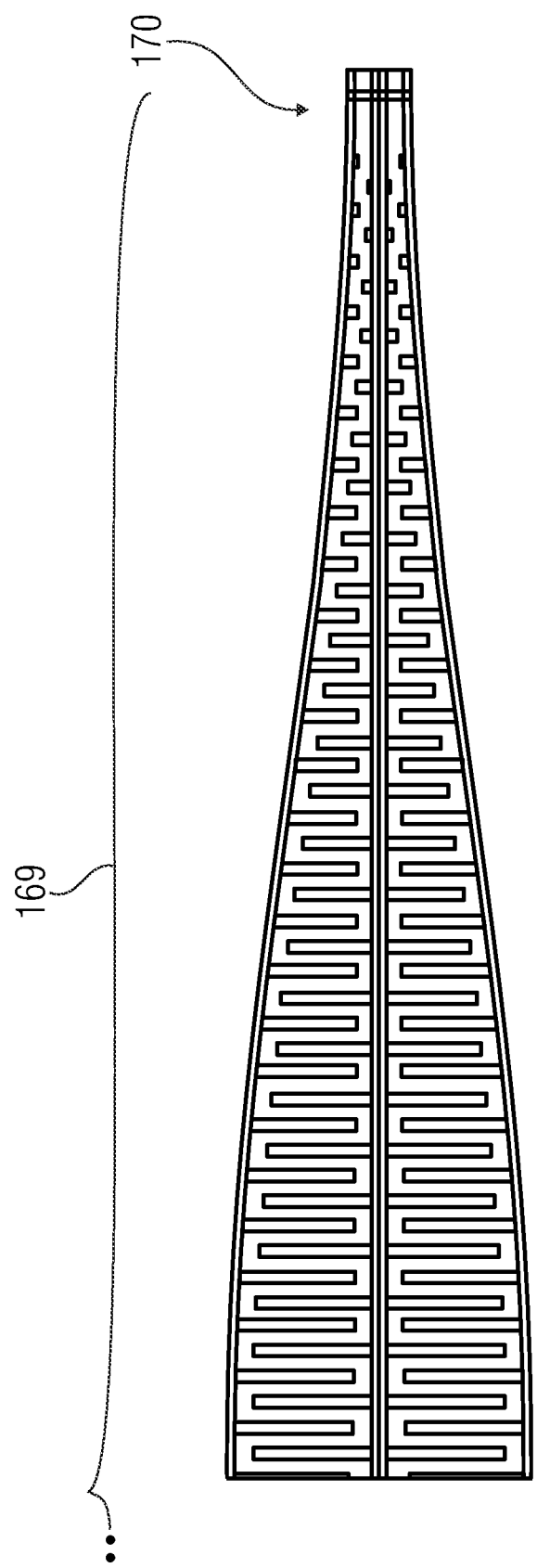
FIG. 21a is a schematic representation of a half segment with comb electrodes for increasing the depositable electric field energy with a convex segment configuration compared to FIG. 19c.
Figure 21B:
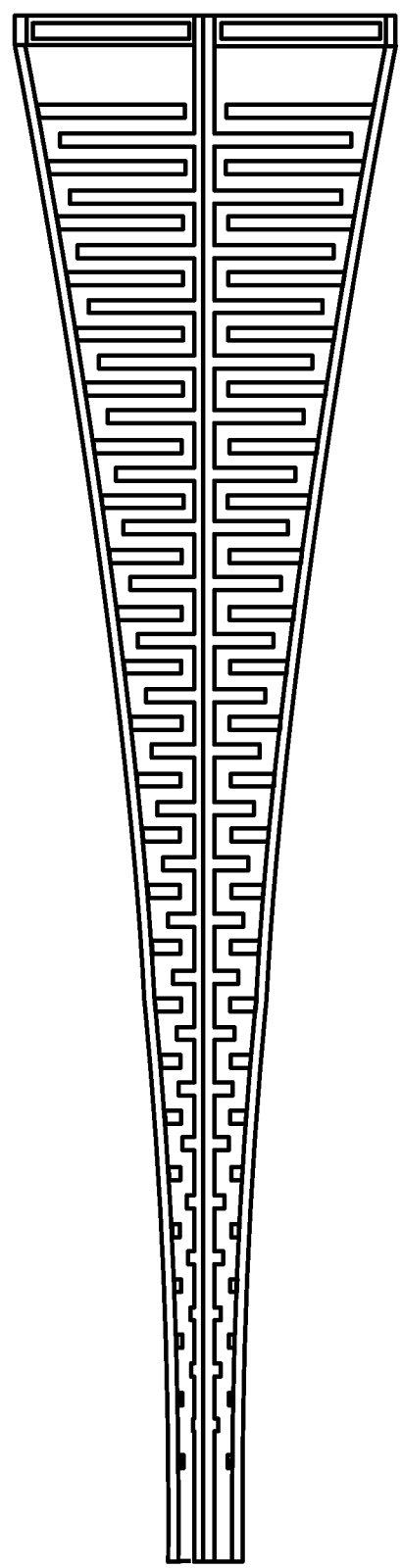
FIG. 21b is a schematic representation of a half segment with comb electrodes for increasing the depositable electric field energy with a concave segment configuration compared to FIG. 19c.

In particular, FIG. 20a shows the case in which each segment 169 is formed such that electrodes 151 and 154 of the two electrodes 151 and 154 opposite each other via the centroid fiber 130 are each bulged forward by the centroid fiber 130, the space 1304 and 1404 separating the same from the other electrode 152 and 153, respectively, being of approximately constant thickness in the direction of the centroid fiber 130. In other words, the inner electrodes 152 and 153 in segments 169 are also curved away from the centroid fiber 130. In the case of FIG. 21a, the deflectable element between the inner electrodes 152 and 153 is integrally connected, i.e. without a cavity. FIG. 21b shows a modification of the embodiment of FIG. 21a in which a cavity 1500 is formed between electrodes 152 and 153. FIG. 21c shows a variation in which the inner electrodes 152 and 153 are not bulged outward from the centroid fiber 130, but remain parallel to the centroid fiber 130, so that the cavity 1304/1404 separating these electrodes 152, 153 from the respective distal electrodes 151/154 has a varying thickness in the longitudinal direction x, in particular increasing from the segment boundaries 170 towards the center of the segment.

Figure 20B:
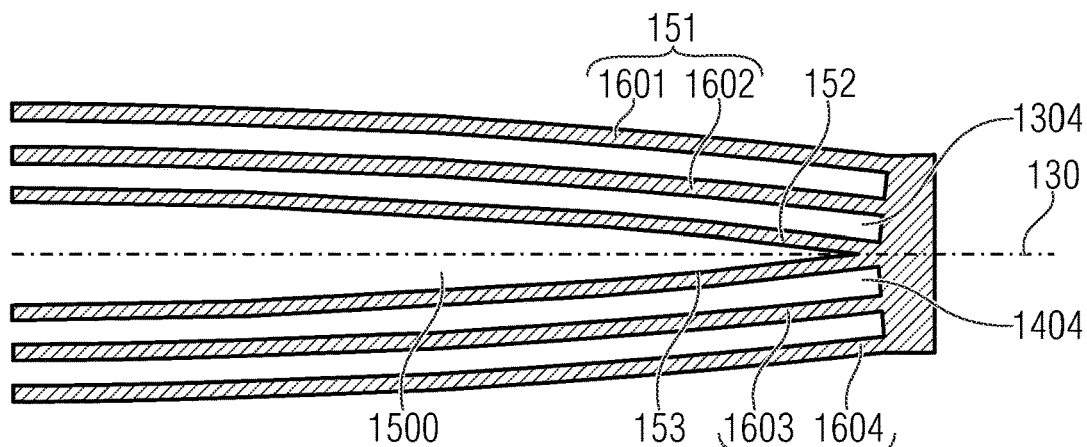
Figure 20C:
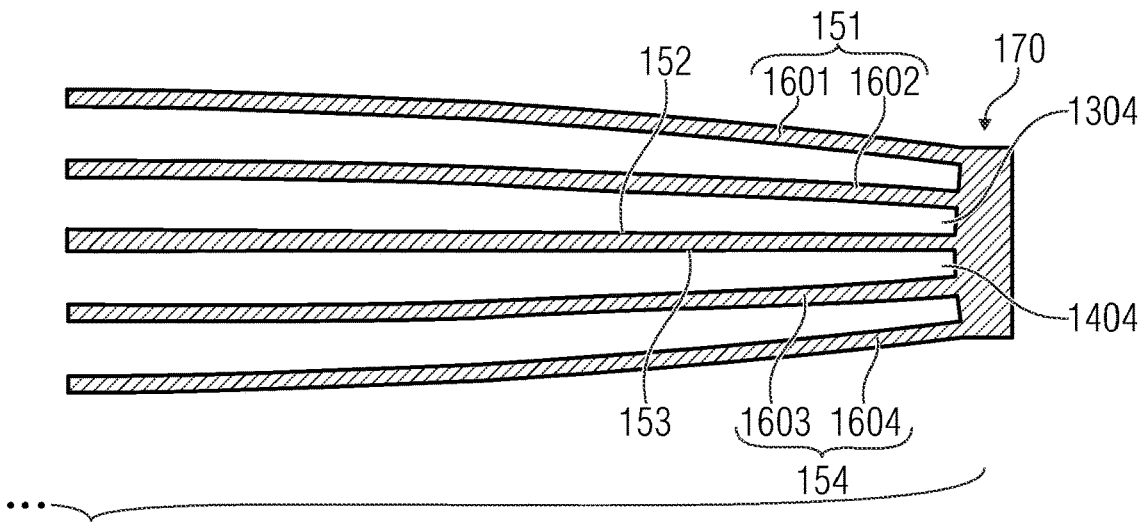
FIG. 20c is a schematic representation of a deflectable element in which, in contrast to FIG. 20a, the proximal electrodes are configured to be plane-parallel and not convexly bulging.

FIG. 20a-c show a configuration in which the distal electrodes 151 and 154 are multilayered. This means that in the configurations of FIGS. 20a and 20b, the deflectable element in each segment is configured in such a way that it bulges out between the segment boundaries 170 in both directions away from the centroid fiber 130, i.e. becomes thicker towards the center of the segment, so that the proximal electrodes 151 and 152 also bulge out accordingly. In accordance with the proximal electrodes 152 and 153, two layers 1601, 1602 forming the electrode 151 and electrode layers 1603 and 1604 forming the electrode 151 extend respectively on the side of the proximal electrodes 152 and 153 facing away from the centroid fiber 130. Between the electrode pairs 1601 and 1602 and 1603 and 1604, respectively, a cavity of constant thickness along the longitudinal direction x is again formed. The layers 1601-1602 on the one hand and 1603 and 1604 on the other hand can be provided with the same potential. Alternatively, it would be possible to modify each MEMS transducer to be equipped with three electrodes 152, 1601 and 1602 or 153, 1603 and 1604. FIG. 20c shows that the cavity between the pairs of layers 1601 and 1602 or 1603 and 1604 could be of varying thicknesses along the longitudinal direction x, i.e. at a maximum at the center of the segment.

FIGS. 21a and 21b show a modification of the configuration of FIG. 19c, with the exception that the distal electrodes 151 and 154 in each segment are concavely or convexly bulged, respectively, i.e. in the convex case according to FIG. 21a, bulged out most in the center of the segment and, in the case of FIG. 21b, bulged closest to the proximal electrodes 152 and 153 while projections of the electrodes 151-154 engage or project into one another, respectively, in a comb-like manner.

FIGS. 20a to 21b show topographies which, compared to the topographies shown so far, allow a greater amount of energy to be deposited and thus allow a greater deflection of the actuator. In particular, the double electrode structure of the distal electrodes according to FIG. 20a-c and the concave-convex curved configuration of the distal electrodes with interdigital design of the electrodes allow advantages with regard to high amounts of depositable energy and at the same time with regard to a topology suitable for the material in order to enable the greatest possible deflection.

Figure 22:
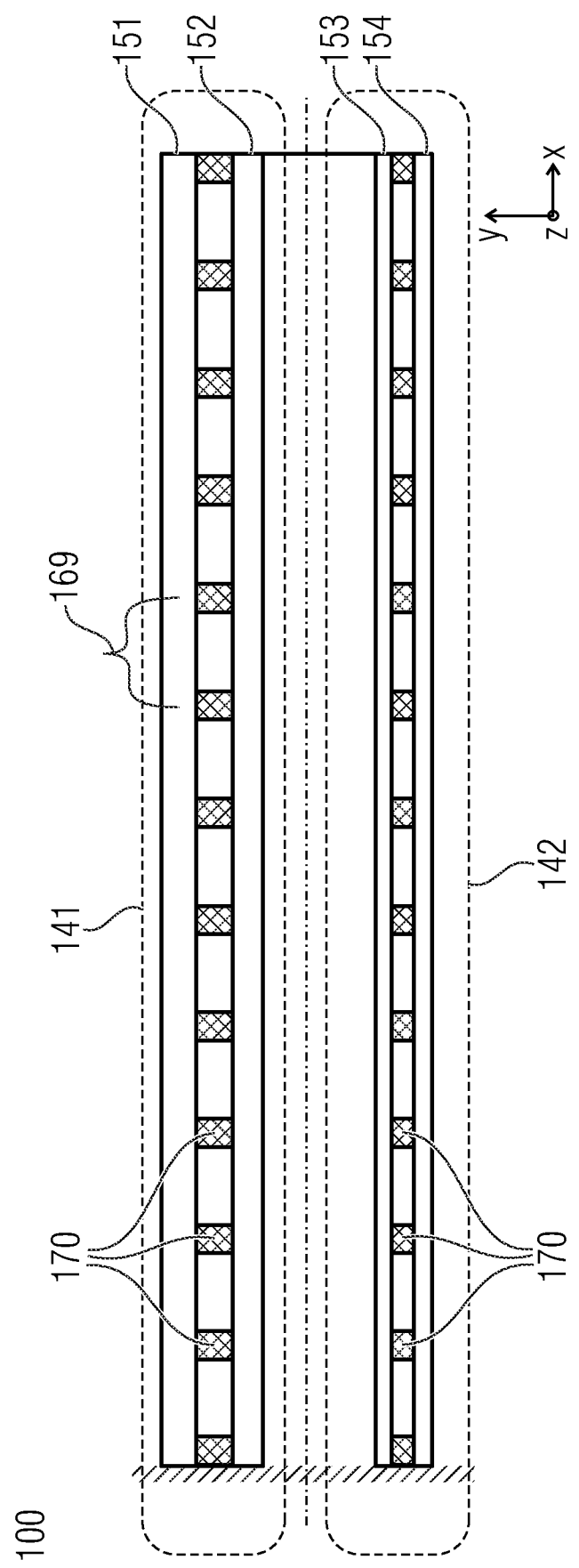

FIG. 22 discloses an embodiment of an asymmetrical actuator 100 or a bending transducer 100 with an asymmetrically configured deflectable element 110, which is cantilevered. The electrodes 151 and 152 of the first MEMS transducer are 141 thicker than the electrodes 153 and 154 of the second MEMS transducer 142. This also increases the distance between the electrodes 151 and 152. Advantageously, the asymmetrical structure results in an asymmetrical effect of the actuator. FIG. 22 thus illustrates a possibility of structural asymmetry that can be used to compensate external asymmetries.

Thus, the above embodiments make it possible to design hick transducers that operate particularly linearly in a wide dynamic and frequency range. According to the embodiments, only moderate voltages are needed. At the same time, the same have a high level of performance.

While this invention has been described in terms of several advantageous embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Bending transducer as actuator with a deflectable element, comprising
    a first microelectromechanical transducer extending along a centroid fiber of the deflectable element that deflects the deflectable element in a first direction when a first electrical signal is applied, and
    a second microelectromechanical transducer extending along the centroid fiber that deflects the deflectable element in a second direction opposite to the first direction when a second electrical signal is applied,
the centroid fiber being located between sides of the first and second microelectromechanical transducers facing away from each other, and
an electrical control configured to vary the first electrical signal and the second electrical signal depending on an input signal, such that a change of the first electrical signal and a change of the second electrical signal to deform deformable electrodes of the first microelectromechanical transducer and deformable electrodes of the second microelectromechanical transducer depend on the electrical input signal, and the phases of the first and second electrical signals are shifted with respect to one another, wherein the first microelectromechanical transducer comprises a first plate capacitor with deformable electrodes and the second microelectromechanical transducer comprises a second plate capacitor with deformable electrodes, the first and second plate capacitor segmented along a longitudinal direction of the deflectable element, and wherein the electrical control is configured to apply a combination of a first bias and a first signal portion depending on the input signal as the first electrical signal to the first microelectromechanical transducer and a combination of a second bias and a second signal portion depending on the input signal as the second electrical signal to the second microelectromechanical transducer.

2. Bending transducer according to claim 1, wherein the electrodes of the first and second plate capacitors are configured to be interdigital.

3. Bending transducer according to claim 1, wherein the first bias and the second bias are adjusted such that the centroid fiber of the deflectable element is not deflected without first and second signal portions depending on the input signal and without external mechanical influences on the deflectable element.

4. Bending transducer according to claim 1, wherein the electrical control is configured such that the spring stiffness of the bending transducer and/or the sensitivity of the bending transducer and/or the resonance frequency of the bending transducer are adjustable by adjusting the bias or the biases at the first and/or at the second microelectromechanical transducer.

5. Bending transducer according to claim 1, wherein the electrical control is configured to perform the change of the first and second electrical signals with differing amplitudes to compensate an asymmetrical load on the deflectable element.

6. Bending transducer according to claim 5, wherein the asymmetrical load is a structural asymmetry of the microelectromechanical transducer and/or an asymmetrical force acting on the deflectable element.

7. Bending transducer according to claim 5, wherein the electrical control comprises a feedback loop for dynamically compensating the effect of the asymmetrical load.

8. Bending transducer system comprising a plurality of bending transducers according to claim 1, wherein the bending transducers match with respect to a dimensioning of the microelectromechanical transducers, wherein the spring stiffnesses and/or the resonance frequencies and/or the sensitivities of the plurality of bending transducers are individually adjustable via a bias to the first and/or second microelectromechanical bending transducers.

9. Bending transducer system comprising a plurality of bending transducers according to claim 1 and a splitting circuit configured to spectrally split a total input signal into a plurality of input signals being obtained for the plurality of bending transducers.

10. Bending transducer system comprising a plurality of bending transducers according to claim 1 and a circuit configured to cause a first part of the total amount of the bending transducers to be operated as actuators and a second part of the total amount of the bending transducers to be operated as sensors, the partitioning of the subsets depending on a control signal.

11. Bending transducer system comprising a plurality of bending transducers according to claim 1, wherein a bending transducer is controlled in a time interval both as actuator and as sensor, or the bending transducer is controlled in a first time interval as sensor and in a second time interval as actuator, or the bending transducer is controlled in a first time interval as actuator and in a second time interval as sensor.

* * * * *